United States Patent
Tanaka et al.

(10) Patent No.: US 6,795,358 B2
(45) Date of Patent: Sep. 21, 2004

(54) SEMICONDUCTOR INTEGRATED CIRCUIT DEVICE

(75) Inventors: Yousuke Tanaka, Ome (JP); Tomofumi Hokari, Ome (JP); Masatoshi Hasegawa, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/459,625

(22) Filed: Jun. 12, 2003

(65) Prior Publication Data

US 2003/0235101 A1 Dec. 25, 2003

(30) Foreign Application Priority Data

Jun. 24, 2002 (JP) ........................................ 2002-182687
Mar. 20, 2003 (JP) ..................................... 2003-0077031

(51) Int. Cl.[7] .............................................. G11C 7/00
(52) U.S. Cl. ............. 365/203; 365/185.25; 365/189.01; 365/205
(58) Field of Search ................................ 365/203, 205, 365/189.01, 63, 185.25, 190, 23

(56) References Cited

U.S. PATENT DOCUMENTS

| | | | |
|---|---|---|---|
| 6,301,173 B2 | 10/2001 | Fujioka et al. | |
| 6,584,031 B2 * | 6/2003 | Fujisawa et al. | ............ 365/226 |
| 6,687,175 B1 * | 2/2004 | Mizuno et al. | ............. 365/203 |
| 2001/0015928 A1 | 8/2001 | Fujioka et al. | |

FOREIGN PATENT DOCUMENTS

| | | |
|---|---|---|
| JP | 4-186593 | 11/1990 |
| JP | 4-283492 | 3/1991 |
| JP | 6-243682 | 2/1993 |
| JP | 8-190790 | 1/1995 |
| JP | 10-178161 | 12/1996 |
| JP | 11-31794 | 7/1997 |
| JP | 11-086529 | 9/1997 |
| JP | 2000-100171 | 9/1998 |

* cited by examiner

Primary Examiner—Van Thu Nguyen
Assistant Examiner—Toan Le
(74) Attorney, Agent, or Firm—Reed Smith LLP; Stanley P. Fisher, Esq.; Juan Carlos A. Marquez, Esq.

(57) ABSTRACT

Disclosed herein is a semiconductor integrated circuit device equipped with a memory circuit, which realizes the speeding up of its operation and low power consumption thereof in a simple configuration. At input/output nodes of a sense amplifier including a CMOS latch circuit for performing an amplifying operation in response to an operation timing signal, a pair of first precharge MOSFETs brought to an on state during a precharge period to thereby supply a precharge voltage, and select switch MOSFETs for connecting the input/output nodes and each complementary bit line pair in response to a select signal are provided. A second precharge MOSFET for short-circuiting the complementary bit line pair is provided between the complementary bit line pair. A memory array is provided which includes dynamic memory cells each comprising an address selecting MOSFET and a storage capacitor, each of which is provided between one of the complementary bit line pair and a word line intersecting it. The thickness of a gate insulating film for the second precharge MOSFET is formed thin as compared with that of a gate insulating film for the selecting MOSFETs.

13 Claims, 31 Drawing Sheets

□: L LAYER
▨: FG LAYER
□: BL LAYER

TO FIGURE 29

SEMICONDUCTOR INTEGRATED CIRCUIT DEVICE

BACKGROUND OF THE INVENTION

The present invention relates to a semiconductor integrated circuit device, and to a technology effective for application to a semiconductor integrated circuit device equipped with a memory circuit.

It has been reported from the result of a known-example search subsequent to the completion or achievement of the invention of the present application that as ones related to such complementary bit-line precharge as described in the invention of the present application, there have been provided (1) gate boost precharge, (2) Unexamined Patent Publication No. 2000-100171 cited or listed below as a Patent Document 1, and (3) Unexamined Patent Publication No. Hei 10 (1998)-178161 cited or listed below as a Patent Document 2. (1) is intended to boost the gate of a precharge MOS transistor to VPP (word line voltage) to thereby speed up a precharge operation for the purpose of speeding up of bit line precharge. (2) is intended to dispose only a short MOS transistor of a precharge circuit outside a shared MOS transistor to thereby speed up a precharge operation for the purpose of speeding up of bit line precharge. (3) aims to reduce a threshold voltage of a transistor of a precharge circuit to thereby speed up a precharge operation for the purpose of speeding up of bit line precharge.

Patent Document 1:
Unexamined Patent Publication No. 2000-100171
Patent Document 2:
Unexamined Patent Publication No. Hei 10 (1998)-178161

SUMMARY OF THE INVENTION

In the above technology of (1), power consumption of a generator for generation of a word line voltage (VPP) used as a start signal of a short MOS transistor increases. Since a mat activation rate of a high-speed mixed DRAM intended for, for example, a cache memory or the like becomes even twenty times that of a general purpose DRAM, current consumption based on VPP for boosting the gate of the precharge MOS transistor reaches even 2A or more according to a trial calculation made by the inventors or the like of the present application. Although the above technology of (2) (Patent Document 1) has described that "a control signal for the short MOS transistor is reduced to a voltage less than or equal to a shared MOS transistor control signal to thereby achieve low power consumption", such consideration that a "thin-film transistor" is used for the short MOS transistor and its level is reduced to a bit line voltage level", is not paid. The present technology has no description about a layout shape of the short MOS transistor per se and its layout method. Although the above technology of (3) (Patent Document 2) describes that "a two-dimensional form or the like of a precharge transistor is varied to reduce a threshold voltage thereof", there is no consideration that the voltage of a control signal itself is reduced to achieve low power consumption.

An object of the present invention is to provide a semiconductor integrated circuit device equipped with a memory circuit, which realizes the speeding up of its operation and low power consumption thereof in a simple configuration. The above, other objects and novel features of the present invention will become apparent from the description of the present specification and the accompanying drawings.

A summary of a representative one of the inventions disclosed in the present application will be described in brief as follows: At input/output nodes of a sense amplifier including a CMOS latch circuit for performing an amplifying operation in response to an operation timing signal, a pair of first precharge MOSFETs brought to an on state during a precharge period to thereby supply a precharge voltage, and select switch MOSFETs for connecting the input/output nodes and each complementary bit line pair in response to a select signal are provided. A second precharge MOSFET for short-circuiting the complementary bit line pair is provided between the complementary bit line pair. A memory array is provided which includes dynamic memory cells each comprising an address selecting MOSFET and a storage capacitor, each of which is provided between one of the complementary bit line pair and a word line intersecting it. The thickness of a gate insulating film for the second precharge MOSFET is formed thin as compared with that of a gate insulating film for the selecting MOSFETs.

DETAILED DESCRIPTION OF THE PREFERRED EMBODIMENTS

Figure 1:
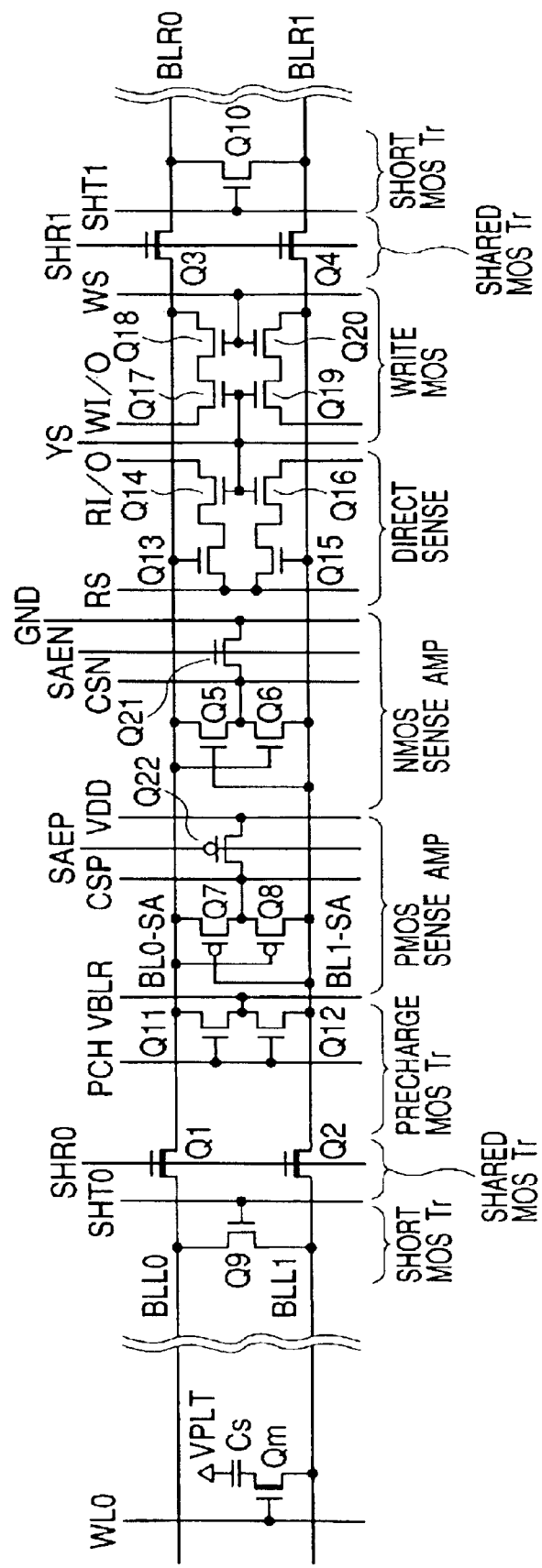
FIG. 1 is a fragmentary circuit diagram showing one embodiment of a memory cell array section employed in a dynamic RAM according to the present invention.

FIG. 1 is a fragmentary circuit diagram of one embodiment of a memory cell array section employed in a dynamic RAM according to the present invention. In the same drawing, one word line WL0 shown as typical, two pairs of complementary bit lines BLL0 and BLL1, and BLR0 and BLR1, and a sense amplifier, a precharge circuit, a read-system circuit and a write-system circuit related to these, etc. are illustratively shown as representative. In the same drawing, those marked with O indicative of inversion at gates means P channel MOSFETs respectively. The P channel MOSFETs are distinguished from N channel MOSFETs by such marks.

A dynamic memory cell (Memory Cell) comprises an address selecting MOSFET Qm and an information storage capacitor Cs. The gate of the address selecting MOSFET Qm is connected to its corresponding word line WL0, and one of the source and drain of the MOSFET Qm is connected to its corresponding bit line BLL1. The other thereof is connected to its corresponding storage node of the information storage capacitor Cs. The other electrode of the information storage capacitor Cs is used in common and supplied with a plate voltage VPLT. Although not restricted in particular, the word line WL0 corresponds to a sub word line when it is taken as a division or split word line (or hierarchical word line) system made up of the main word lines and sub word lines.

The bit lines BLL0 and BLL1 are disposed in parallel as shown in the same drawing. Although not restricted in particular, the bit lines BLL0 and BLL1 are suitably crossed where necessary in order to keep a capacitive balance or the like therebetween. Such complementary bit lines BLL0 and BLL1 are respectively connected to input/output nodes BL0-SA and BL1-SA of each sense amplifier by means of shared switch MOSFETs Q1 and Q2. A unit circuit constituting the sense amplifier is made up of a CMOS latch circuit comprising N channel type MOSFETs Q5 and Q6 and P channel type MOSFETs Q7 and Q8 whose gates and drains are respectively cross-connected so as to take a latch configuration. The sources of the N channel type MOSFETs Q5 and Q6 are connected to a common source line CSN. The sources of the P channel type MOSFETs Q7 and Q8 are connected to a common source line CSP. These common source lines CSP and CSN are connected commonly to their corresponding sources of P channel type MOSFETs and N channel type MOSFETs similar to the above, of another similar CMOS latch circuit.

A power switch MOSFET Q22 corresponding to a P channel type MOSFET is provided for the common source line CSP. An active or enable signal SAEP for the sense amplifier is supplied to the gate of the power switch MOSFET Q22, so that the power switch MOSFET Q22 is brought to an on state in synchronism with a low level of the timing signal SAEP, thereby supplying a power supply voltage VDD to the common source line CSP. An N channel type power switch MOSFET Q21 is provided even for the common source line CSN corresponding to the N channel type MOSFETs Q5 and Q6. A timing signal SAEN is supplied to the gate of the N channel type power switch MOSFET Q21, so that the N channel type power switch MOSFET Q21 is brought to an on state in synchronism with a high level of the timing signal SAEN to thereby supply a ground potential GND to the common source line CSN.

A precharge circuit comprising switch MOSFETs Q11 and Q12 for respectively supplying a half precharge voltage VBLR to the complementary bit lines BLL0, BLL1, BLR0 and BLR1 is provided at the input/output nodes BL0-SA and BL1-SA of the sense amplifier. The gates of these MOSFETs Q11 and Q12 are respectively supplied with a precharge signal PCH in common.

In the present embodiment, a switch MOSFET Q9, which is brought to an on state during a precharge period to short-circuit high/low levels of the bit lines BLL0 and BLL1, thereby setting the bit lines to a substantial precharge voltage, is provided between the bit lines BLL0 and BLL1. Incidentally, although not shown in the drawing, a precharge circuit comprising a switch MOSFET for short-circuiting these common source lines CSP and CSN and a switch MOSFET for supplying the half precharge voltage VBLR is provided even for the common source lines CSP and CSN of the sense amplifier. The gate of the switch MOSFET Q9 for short-circuiting the high level/low level of the bit lines BLL0 and BLL1 to set them to the substantial precharge voltage is supplied with a precharge signal SHT0.

A direct sense circuit constituting the read-system circuit, and a write circuit constituting the write-system circuit are provided at the input/output nodes BL0-SA and BL1-SA of the sense amplifier. The direct sense circuit is made up of N channel type MOSFETs Q13 through Q16. The write circuit is made up of N channel type MOSFETs Q17 through Q20.

In the direct sense circuit, the MOSFETs Q14 and Q16 whose gates are respectively connected to a column select line YS, which are provided in association with the amplifying MOSFETs Q13 and Q15, are respectively series-connected to the amplifying MOSFETs Q13 and Q15 whose gates are respectively connected to the input/output nodes BL0-SA and BL1-SA of the sense amplifier. The drain of the MOSFET Q14 used as a column switch is connected to one of complementary read signal lines RI/O, and the MOSFET Q16 is connected to the other of the read signal lines RI/O. The sources of the amplifying MOSFETs Q13 and Q15 are respectively connected to an operation timing signal line RS.

In the direct sense circuit, the MOSFETs Q17 and Q18 and the MOSFETs Q19 and Q20 are respectively connected in a series configuration with the input/output nodes BL0-SA and BL1-SA of the sense amplifier and complementary write signal lines WI/O. The gates of the MOSFETs Q17 and Q19 each used as a column switch are respectively connected to the column select line YS. The gates of the MOSFETs Q18 and Q20 are respectively connected to an operation timing signal line WS.

The sense amplifier employed in the present embodiment is called a shared sense amplifier wherein two pairs of complementary bit lines are provided from side to side with respect to the input/output nodes BL0-SA and BL1-SA. Namely, the input/output nodes BL0-SA and BL1-SA are respectively connected to the left bit lines BLL0 and BLL1 through the shared switch MOSFETs Q1 and Q2. The input/output nodes BL0-SA and BL1-SA are respectively connected to the right bit lines BLR0 and BLR1 through the shared switch MOSFETs Q3 and Q4.

In the present embodiment, select signals SHR0 and SHR1 are respectively applied to the gates of such shared switch MOSFETs Q1 and Q2, and Q3 and Q4 to bring their select levels to a high level like a step-up or boost voltage VPP in a manner similar to a select level of the word line WL0 or the like. Therefore, the shared switch MOSFETs Q1 through Q4 are set so as to have a high threshold voltage identical to the address selecting MOSFET Qm of the dynamic memory cell.

When a memory mat lying on the left side of the sense amplifier is selected, the MOSFETs Q1 and Q2 are held on in response to the signal SHR0 and the signal SHR1 is brought to a low level, so that the bit lines BLR0 and BLR1 of a memory mat lying on the right side thereof are disconnected or shut off. When the right memory mat is selected, the MOSFETs Q3 and Q4 are held on in response to the signal SHR1 and the signal SHR0 is set low in level, so that the bit lines BLL0 and BLL1 of the left memory mat are disconnected. During a precharge period in which a memory access has been completed, the signals SHR0 ad SHR1 are both high in level. During the precharge period, the signals PCH and SHT0 and SHT1 are also rendered high in level so that both bit lines BLL0 and BLL1, and BLR0 and BLR1 are precharged.

Figure 2:
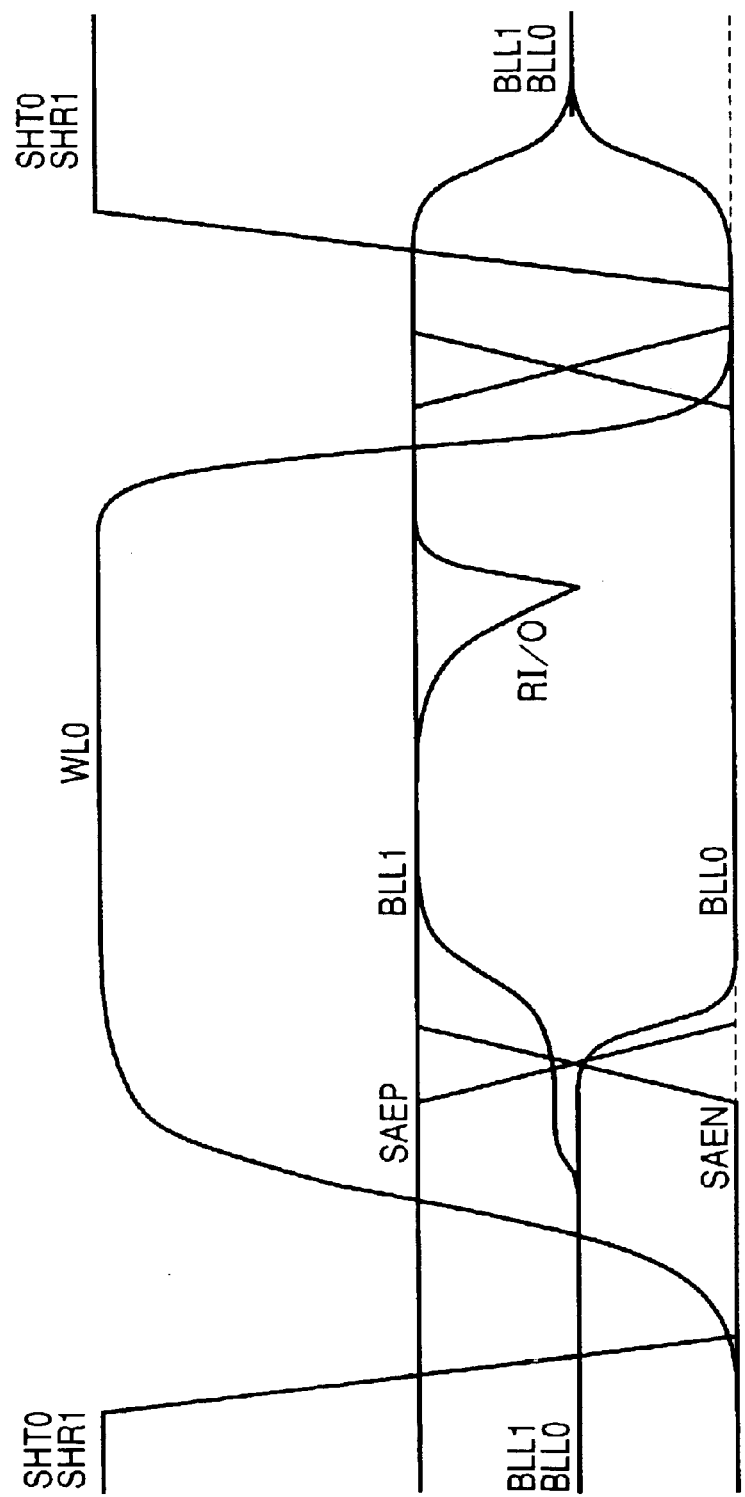
FIG. 2 is a timing diagram for describing one example of the operation of a circuit illustrative of the embodiment shown in FIG. 1.

A timing diagram for describing one example of the operation of the embodiment circuit shown in FIG. 1 is illustrated in FIG. 2. According to the selecting operation of the row system, the shared select signal SHR0 or SHR1 on the non-selection side changes from the high level like the step-up or boost voltage VPP to the low level like the circuit's ground potential. When the left bit lines BLL0 and BLL1 are selected, for example, the shared select signal SHR1 is brought to the low level and hence the bit lines BLR0 and BLR1 are disconnected.

The word line WL0 rises from the low level like the circuit's ground potential VSS to the high level like the step-up voltage VPP. With its rise, one of the bit lines BLL0 and BLL1 is changed to a small voltage corresponding to an information charge of a selected memory cell. With a change of the timing signal SAEP to a low level, the P channel type MOSFET Q22 is brought to an on state. With a change of the timing signal SAEN to a high level, the N channel type MOSFET Q21 is brought to an on state, so that the corresponding sense amplifier is brought to an operating state to amplify the bit lines BLL1 and BLL0 to the high level (VDD) and low level (GND) respectively.

The amplifying MOSFETs are brought to an operating state according to an unillustrated signal RS, and the column switch MOSFETs are turned on by a YS select signal, so that the signals on the input/output nodes BL0-SA and BL1-SA of the sense amplifier are transferred to the read signal lines RI/O through the direct sense circuit. The read signals of the read signal lines RI/O are outputted through an unillustrated main amplifier MA and output circuit.

Although not shown in the drawing, the amplifying operation of the corresponding sense amplifier is started according to each of the timing signals SAEN and SAEP upon a write operation in a manner similar to the read operation. Write signals transferred via the write signal lines WI/O are transferred to the input/output nodes BL0-SA and BL1-SA by the high level of the column select signal YS and the high level of the signal WS. When such write signals as to invert the memory information of the memory cell are transferred thereto, the levels of the input/output nodes BL0-SA and BL1-SA are reversed and thereby the sense amplifier amplifies the same to thereby form high/low levels like the power supply voltage VDD and the GND and transfer the same to the selected memory cell through the bit line BLL0 or BLL1.

Figure 3:
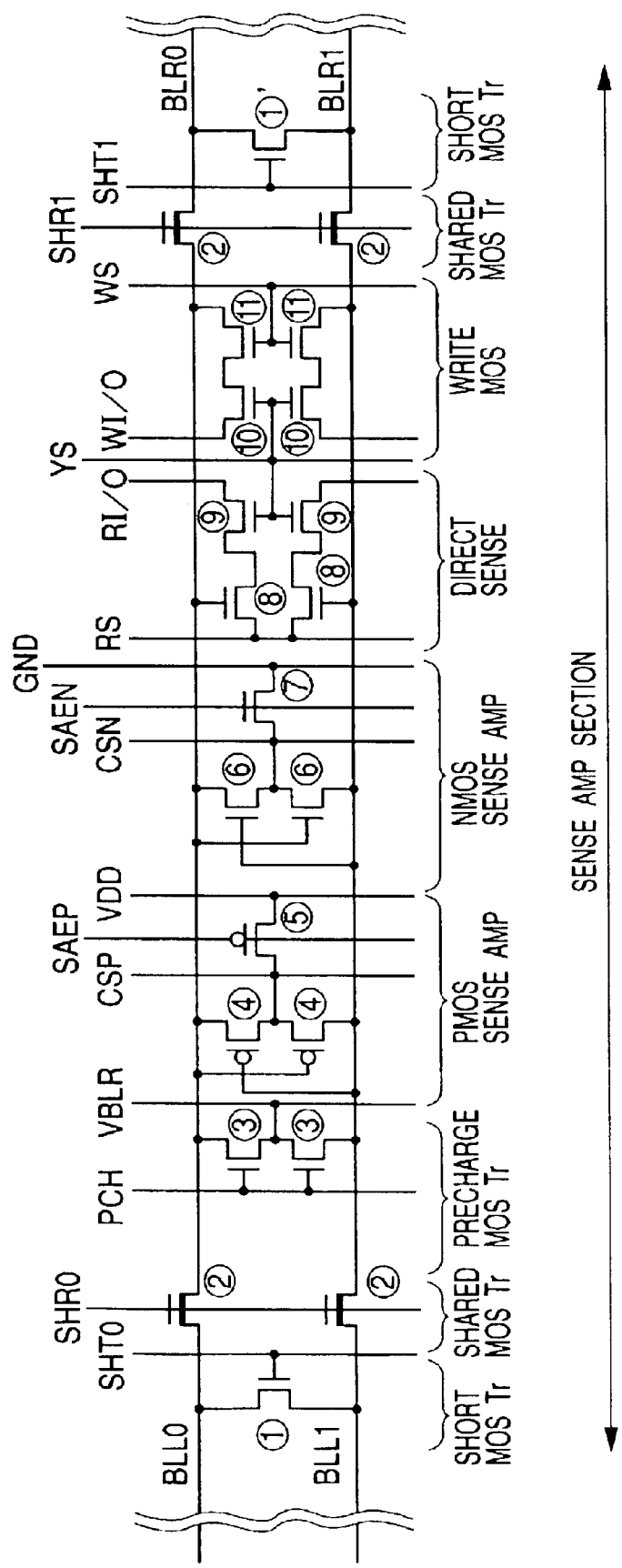
FIG. 3 is a fragmentary circuit diagram showing one embodiment of a memory cell array section employed in a dynamic RAM according to the present invention.

A fragmentary circuit diagram of one embodiment of a memory cell array section employed in a dynamic RAM according to the present invention is shown in FIG. 3. FIG. 3 is a circuit identical to FIG. 1. Circuit symbols ①–⑨, and (10) and (11) different from those in FIG. 1 are added to respective MOSFETs to explain a device layout to be described subsequently. The circuit symbols (10) and (11) are respectively expressed in numerals marked with ○ on the drawing. Respective elements provided in pairs are marked with the same circuit symbols like ② and the like. For instance, the MOSFET Q9 shown in FIG. 1 is expressed in ①, and the MOSFETs Q1 and Q2 are respectively expressed in ②. The MOSFET Q10 shown in FIG. 1 is represented like ①.

Figure 4:
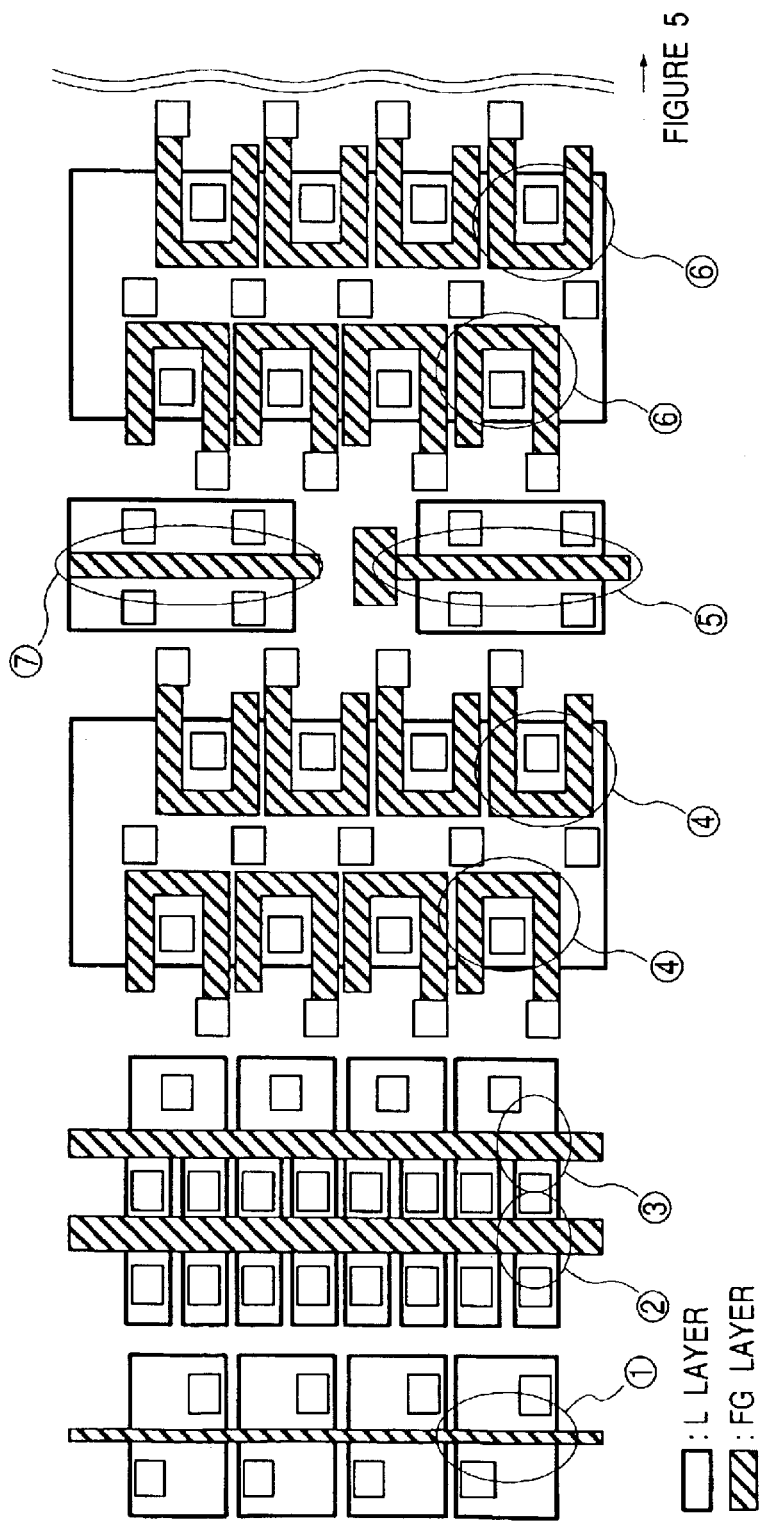
FIG. 4 is a partly layout diagram illustrating L layers and FG layers of respective circuit elements shown in FIG. 3.
Figure 5:
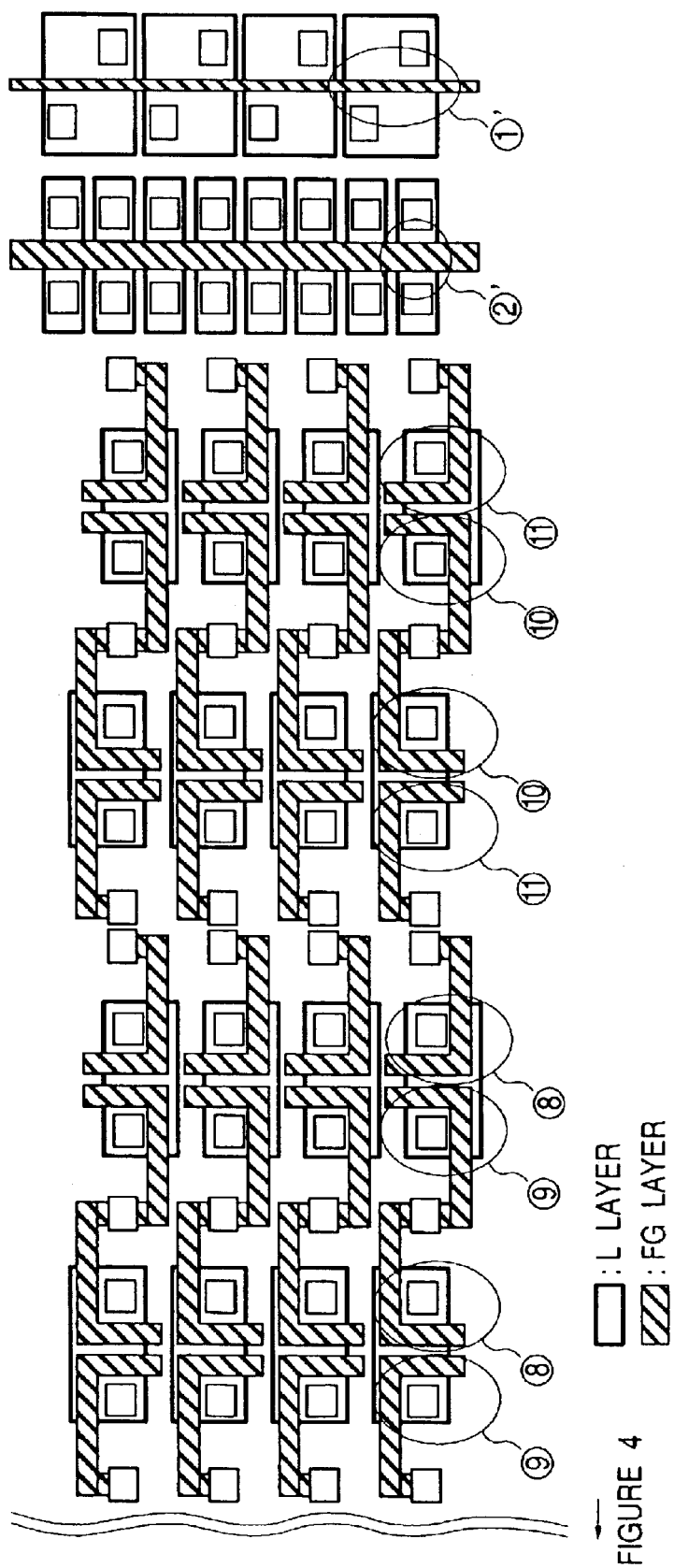
FIG. 5 is a remaining layout diagram illustrating L layers and FG layers of respective circuit elements shown in FIG. 3.

Layout diagrams of the respective circuit elements shown in FIG. 3 are shown in FIGS. 4 and 5 respectively. Namely, lower portions of FIG. 5 are joined to upper portions of FIG. 4 to constitute the respective elements of FIG. 3. Semiconductor layers (L layers) constituting the sources and drains of MOSFETs, and FG layers constituting gate electrodes of the MOSFETs are shown in FIGS. 4 and 5. Contact portions are expressed in □ with respect to the L layers for the sources and drains and the gate electrodes.

In the present embodiment, the MOSFETs of ① constituting the short MOSFETs Q9 and Q10 of a precharge circuit are respectively provided at positions where they are directly connected to their corresponding external portions of ② and ②′ constituting the shared switch MOSFETs Q1 and Q2 and Q3 and Q4 of a sense amplifier section, i.e., complementary bit lines BLL0 and BLL1, and BLR0 and BLR1 with a view toward speeding up a bit line precharge operation. Thus, the MOSFETs ① and ①′ constituting the short MOSFETs Q9 and Q10 disposed outside the sense amplifier section make use of thin-film MOSFETs of MOSFETs formed in a two-type gate oxide film process to be described later. Simultaneously setting the gate electrodes each formed of the FG layer under the completed form to linear gate types enables layouts using phase shift masks.

Figure 6:
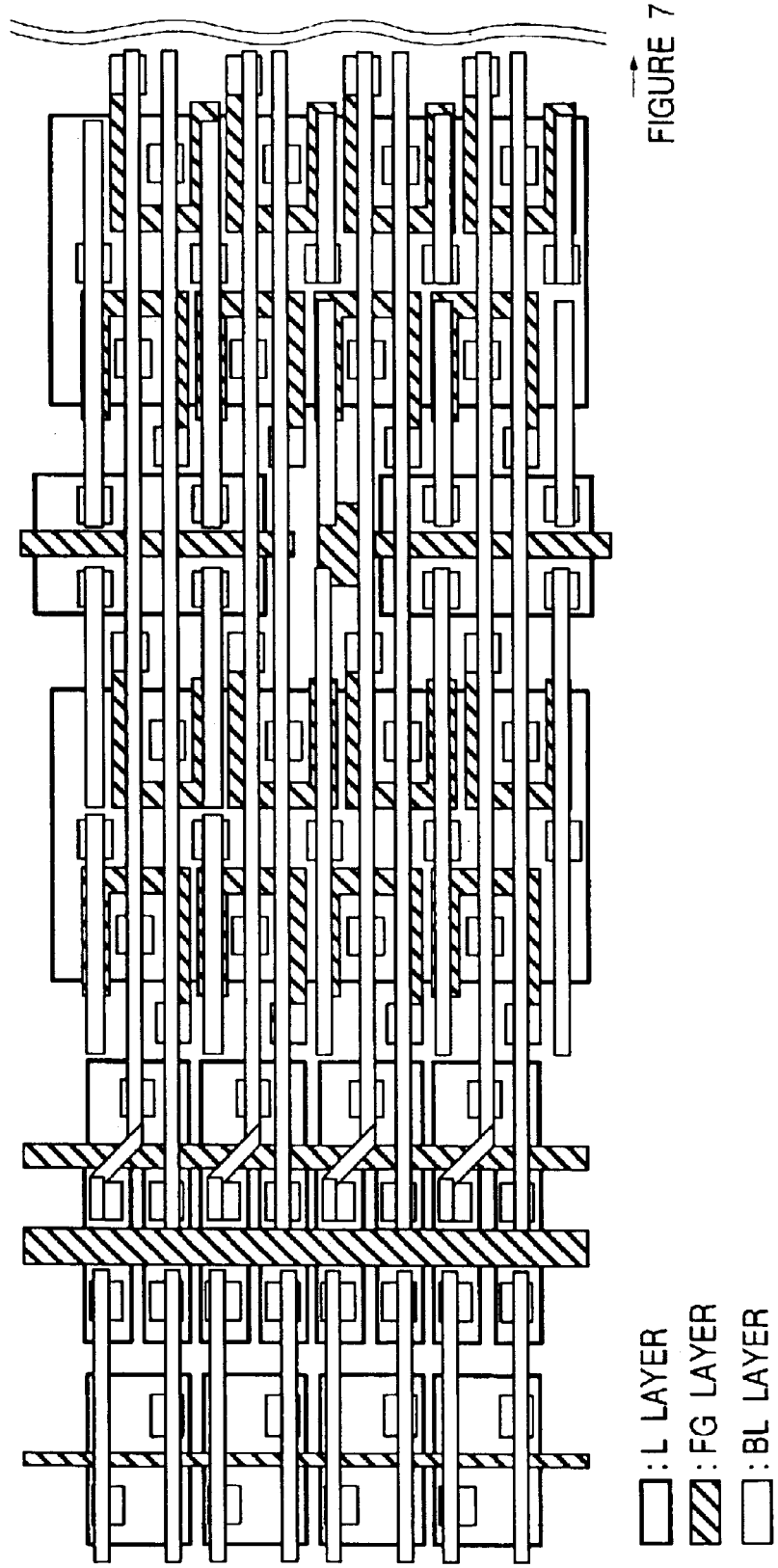
FIG. 6 is a layout diagram illustrating BL layers at an upper part of FIG. 4.
Figure 7:
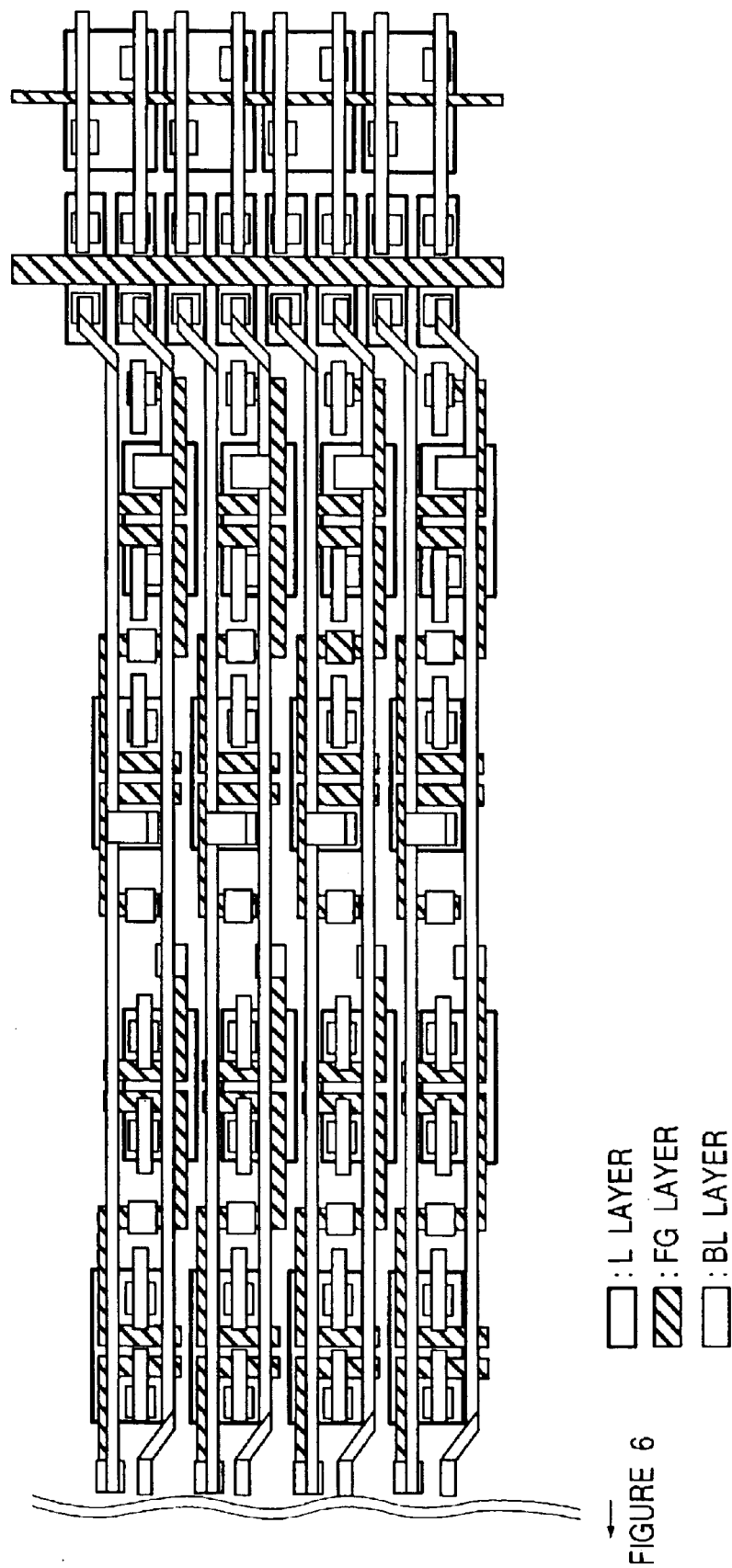
FIG. 7 is a layout diagram illustrating BL layers at an upper part of FIG. 5.

BL layers at upper parts of FIGS. 4 and 5 are shown in FIGS. 6 and 7. In a memory array section, the BL layers constitute bit lines BLL0 and BLL1. Namely, the upper bit line is connected to one of the pair of source and drain semiconductor layers constituting the MOSFETs of ① with the gate electrode interposed therebetween, and the lower bit line is connected to the other thereof. These complementary bit lines extend as they are and are connected to one of the source drain semiconductor layers constituting the MOSFETs of ②. A wiring layer formed in the same process as the bit lines forms each of the input/output nodes BL0-SA and BL1-SA of the sense amplifier section.

Figure 8:
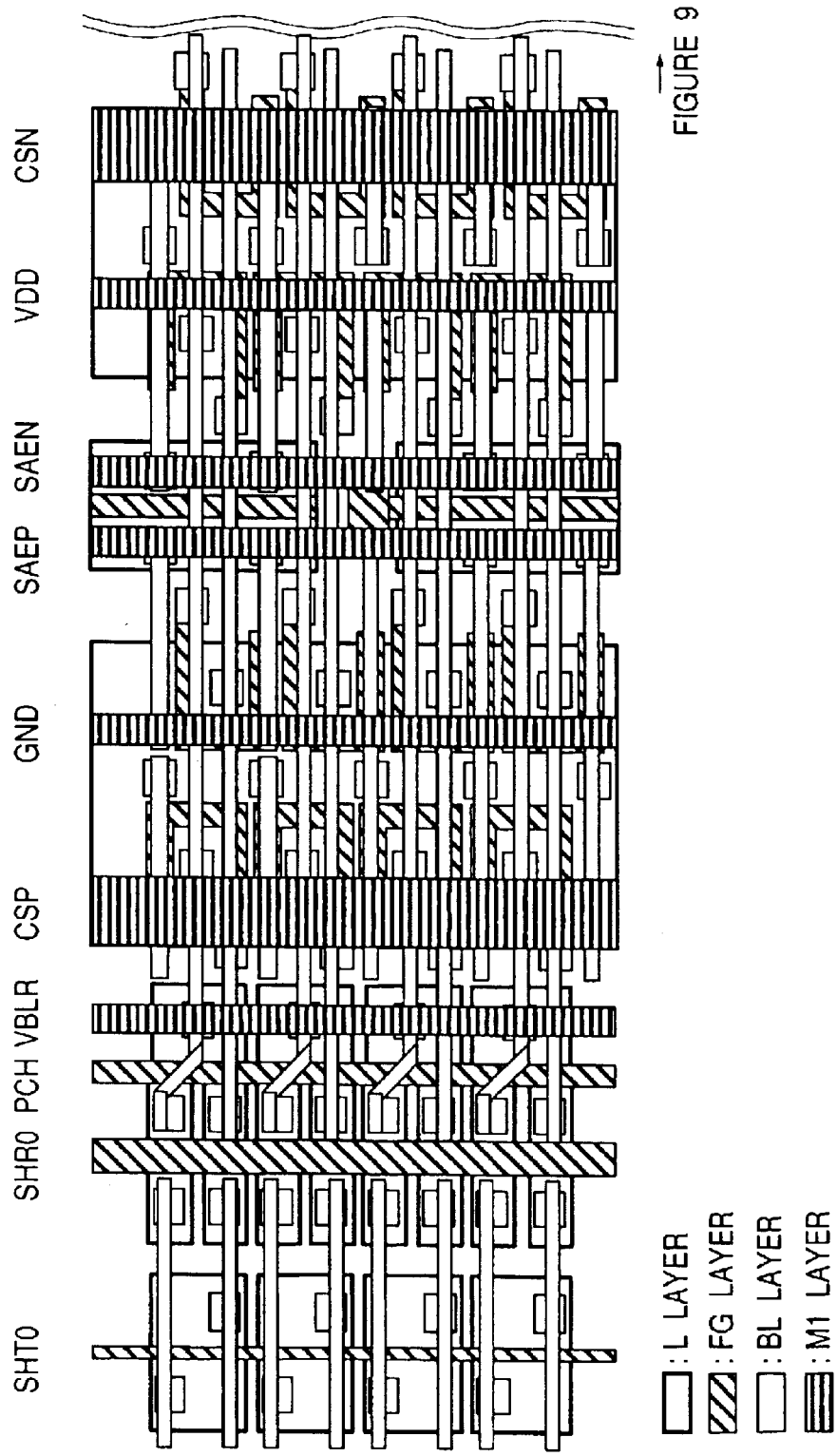
FIG. 8 is a layout diagram illustrating M1 layers at an upper part of FIG. 6.
Figure 9:
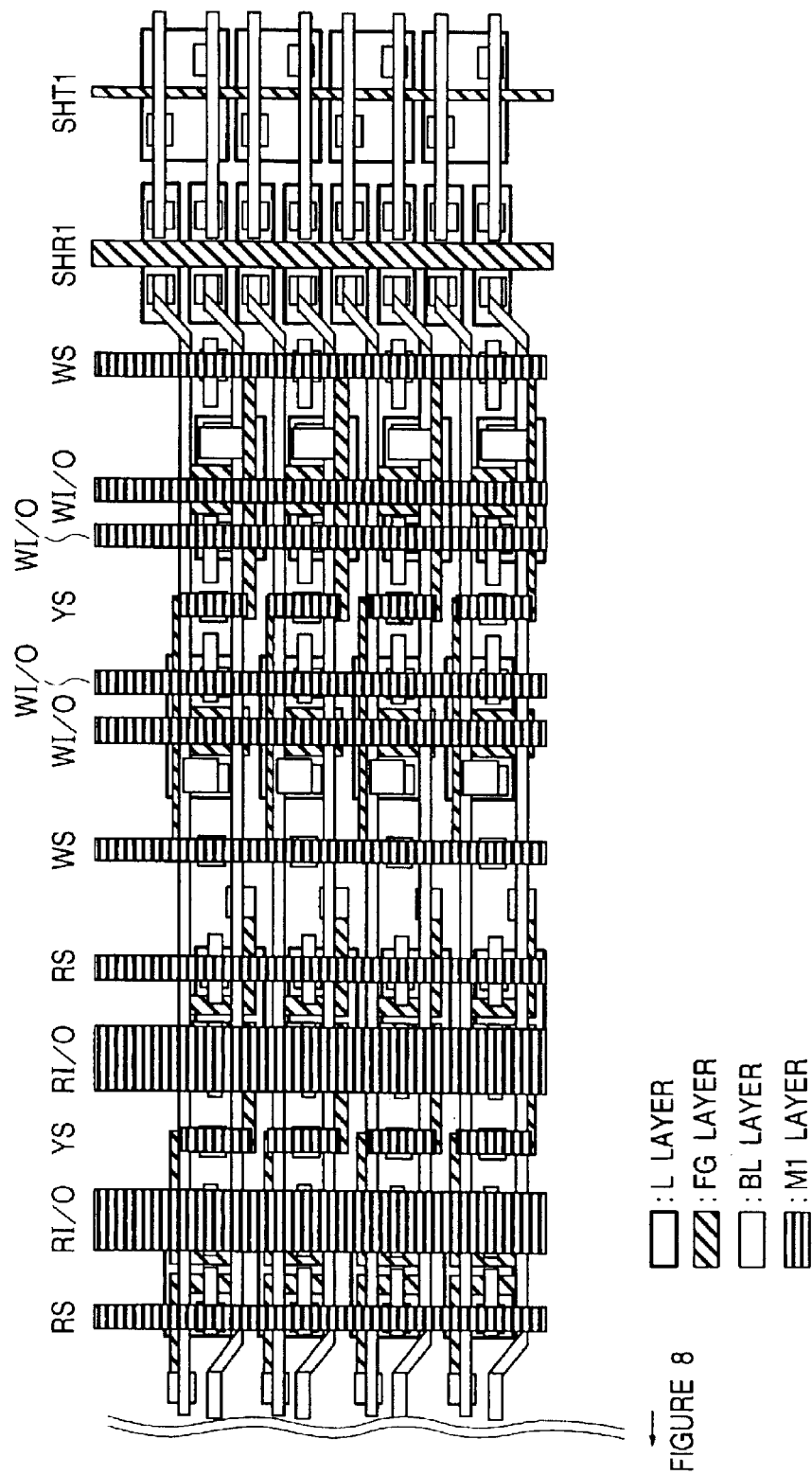
FIG. 9 is a layout diagram illustrating M1 layers at an upper part of FIG. 7.

M1 layers disposed to upper parts of FIGS. 6 and 7 are shown in FIGS. 8 and 9. The M1 layers are metal wiring layers each corresponding to a first layer and are formed of aluminum or the like, for example. The M1 layers are formed so as to extend in the direction normal to the BL layers, i.e., in parallel with a word line or the gate electrodes of the short MOSFETs. In the same drawings, the names of signals to be transferred to the FG layers and M1 layers are given thereto. For example, the FG layers constituting the gate electrodes of the MOSFETs of ① and ①' are respectively supplied with signals SHT0 and SHT1. Signals SHR0 and SHR1 are transferred to the FG layers constituting the gate electrodes of the MOSFETs of ② and ②', and a signal PCH is transferred to the FG layer constituting the gate electrode of the MOSFET of ③. The signals or voltages like VBLR, CSP, GND, SAEP, SAEN, VDD, and CSN shown in FIG. 3 are respectively transferred to the respective wiring layers shown in FIG. 8 constituted of the M1 layers. The signals like RS, RI/O, YS, WS, and WI/O shown in FIG. 3 are respectively transferred to the wiring layers shown in FIG. 9 constituted of the M1 layers.

Figure 10:
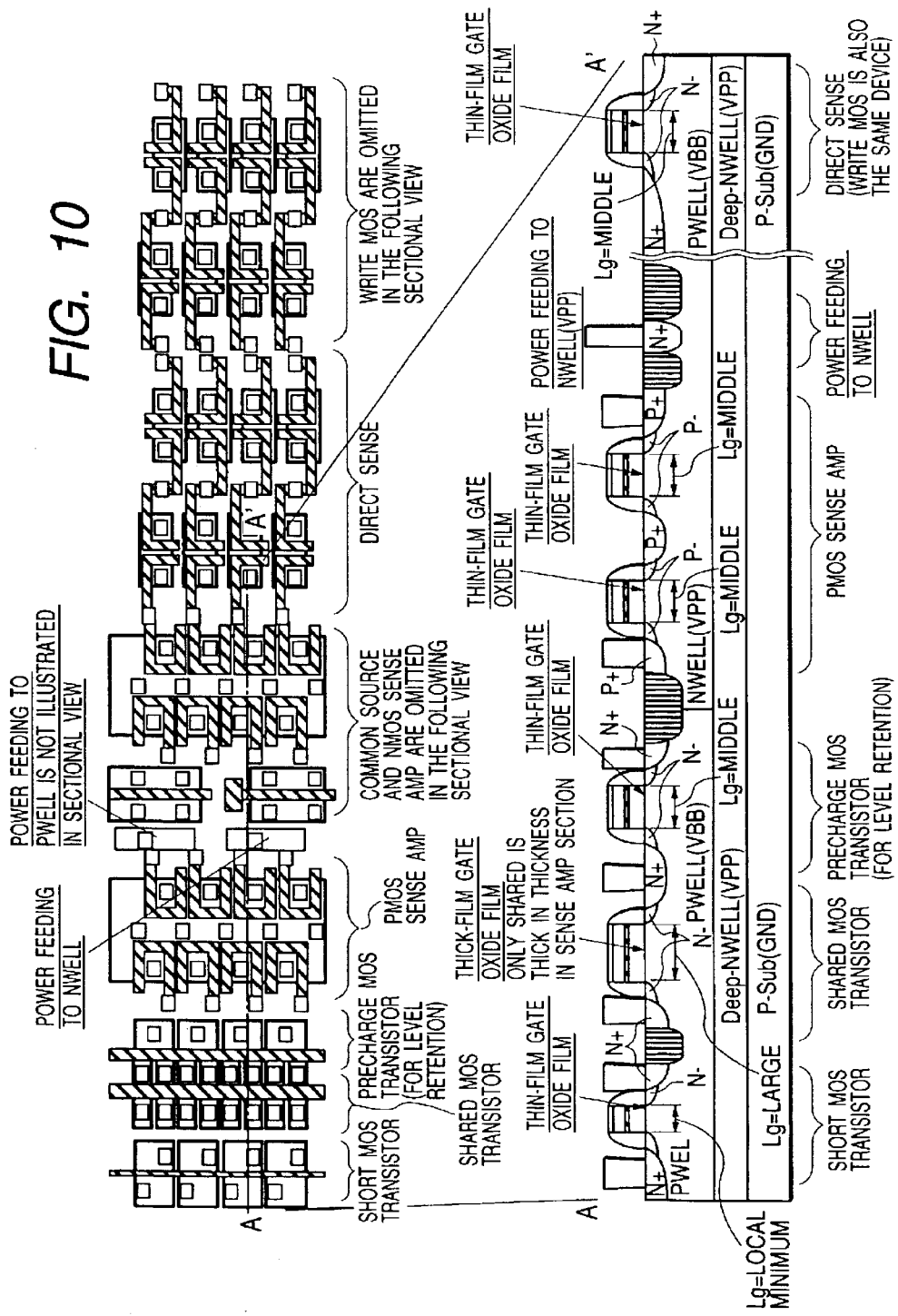
FIG. 10 is a device configurational diagram showing one embodiment of a sense amplifier section shown in FIG. 3.

A device configurational diagram showing one embodiment of a sense amplifier section is shown in FIG. 10. The device patterns shown in FIG. 4 and a sectional structure corresponding to them are shown in the same drawing. A MOSFET corresponding to ① referred to above is a short MOS transistor for complementary bit lines, and a gate insulating film is made up of a thin-film gate oxide film. On the other hand, a shared MOS transistor corresponding to ② includes a gate insulating film formed of a thick-film gate oxide film in a manner similar to the address selecting MOSFET Qm of the unillustrated memory cell. In the sense amplifier section as described above, only the shared MOS transistor makes use of the thick-film gate oxide film, and other MOS transistors respectively make use of the thin-film gate oxide film.

Providing the gate electrode of the short MOS transistor as the linear gate type as in the present embodiment enables a layout using each phase shift mask. Owing to the use of such a technology, a gate size Lg can be processed to the minimum size as compared with ones each having no linear gate as in the case of latch-configured MOSFETs constituting a sense amplifier. Since there is no need to boost a startup signal (gate voltage) to the level of selecting a word line WL0 or the like owing to the formation of the short MOS transistor by the thin-film gate oxide film as in the present embodiment, power consumption developed when a boost voltage for the precharge circuit startup signal is formed, can be reduced. Disposing the short MOS transistor outside the shared MOS transistor makes it possible to precharge each bit line BL at high speed.

When the sense amplifier is operated with respect to the left bit line pair (or right bit line pair) as described above, the shared MOS transistor startup signal SHR1 (SHR0) is caused to fall to disconnect the irrelevant right bit line pair (or left bit line pair) on a circuit basis, so that the sense amplifier section is made effective with respect to the intended bit line pair alone. Namely, the sense amplifier section lying within the left and right shared MOS transistors can commonly use both of the left and right bit line pairs and is effective in area-saving respects.

When the word line WL0 is raised in FIG. 2, small amounts of signals are read into the bit lines BLL0 and BLL1 precharged to a VDD (½ of bit line voltage) equivalent to ½. The sense amplifier startup signal SAEN changes to a high level, and the SAEP changes to a low level, so the sense amplifier starts an amplifying operation to amplify the difference in the small amounts of signals between the bit lines to "H"=VDD and "L"=GND. After the completion of rewriting into the memory cell, the word line falls so that the memory cell is disconnected from the bit lines.

In preparation for the following cycle read/write operation, the pair of bit lines BLL0 and BLL1 amplified to the "H"=VDD (bit line voltage) level and "L"=GND level must be precharged to VDD equivalent to one-half the precharge voltage. Since the short MOS transistor is disposed outside the shared MOS transistor in the present embodiment, the load is reduced by the shared MOS transistor and hence the bit lines can be precharged at high speed. Since such a DRAM as to be operated in a high-speed cycle as in a mixed DRAM needs to significantly shorten a read/write cycle, the operation of turning on and off each precharge signal can be done at high speed.

Figure 11:
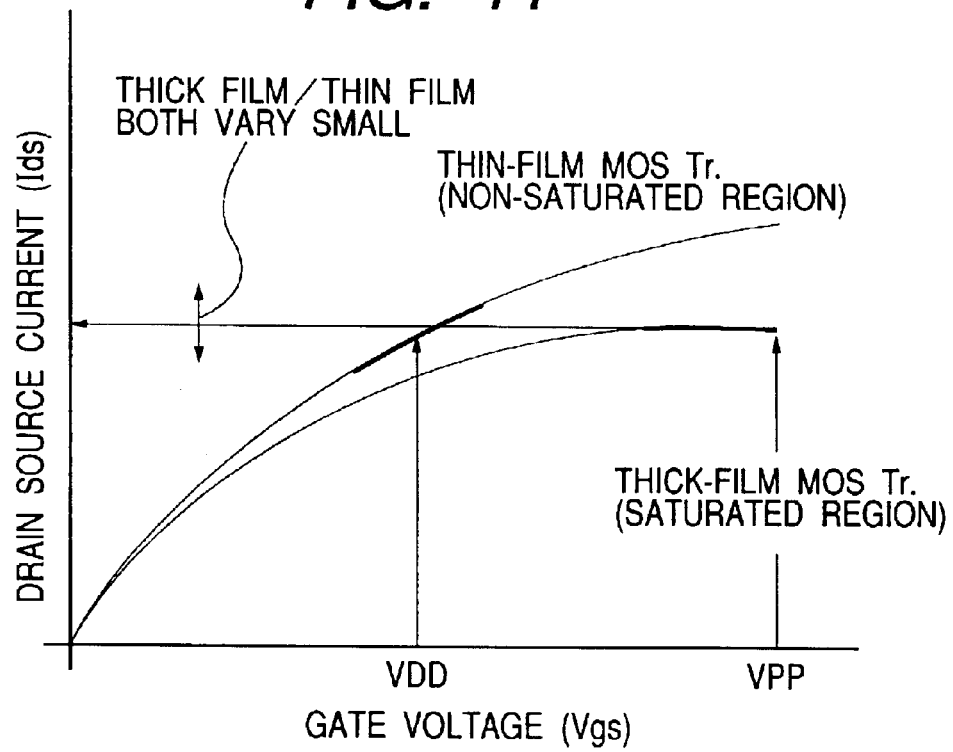
FIG. 11 is a characteristic diagram of precharge MOSFETs employed in the present invention.
Figure 12:
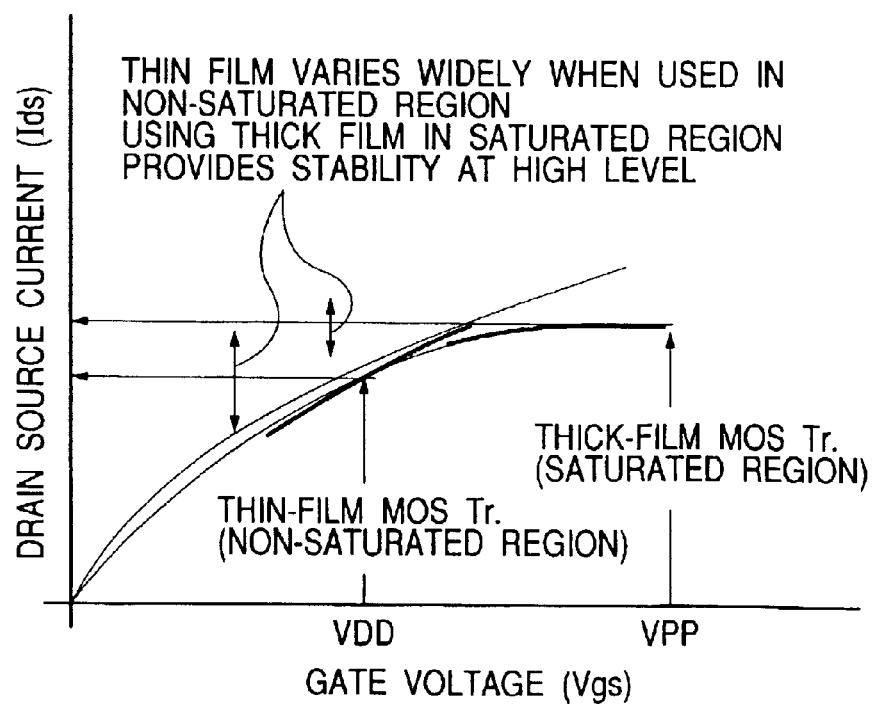
FIG. 12 is a characteristic diagram of precharge MOSFETs for describing the present invention.

In the present embodiment, the short MOS transistor makes use of the thin-film MOS transistor of ones formed in the two-type gate process, and the precharge signals SHT0, SHT1 and PCH are made lower than a word-line select level VPP, thereby suppressing power consumption. When a thick-film transistor is used and a word line voltage corresponding to a step-up or boost level is used as a gate voltage as expressed in a characteristic diagram shown in FIG. 12, a short MOS transistor was brought to a saturated region upon a precharge operation. Thus, even when the level of the gate voltage changes, a constant or more source-drain current Ids more than a constant one could be obtained. Since, however, it is currently easy to enhance the characteristic of the thin-film MOS transistor and perform process control, no problem occurs in terms of practical use even if a thin-film MOS transistor is used in a non-saturated region as represented by a characteristic diagram shown in FIG. 11. A source-drain current Ids at its operation can be also controlled so as to have a current value equivalent to a case in which the thin-film MOS transistor is operated in a saturated region by use of a boost voltage as illustrated in FIG. 12.

The Ids of the short MOS transistor can be also increased for the purpose of further speeding-up. The short MOS transistor disposed outside the shared MOS transistor can be laid out as shown in FIG. 4 or the like. The gate of the short MOS transistor is configured as a linear gate as shown in FIG. 4 or the like. Such a linear gate can be laid out with the thinnest Lg (channel length) within a direct peripheral circuit including a sense amplifier section and a sub word section by using a phase shift mask. Using such a microfabricated MOS transistor makes it possible to increase the Ids and realize the speeding up of the precharge operation.

In the case of such a mixed DRAM to be described later, a LOGIC section makes use of a high-performance transistor rather than a transistor for a DRAM macro-unit peripheral circuit and is smaller in Lg than a transistor of a DRAM unit. The present high-performance transistor can be used for the short MOS transistor. Ids at the precharge operation is increased so that precharge is speeded up.

Further, the gate voltage of the short MOS transistor may be set to the bit line voltage or more to increase Ids.

However, the voltage lower than the word line select level VPP is used. This is needed in terms of prevention of breakdown of a gate withstand voltage of each MOSFET. Thus, the thin-film transistor of ones formed in the two-type gate oxide film process is used, the externally applied voltage is changed within the range in which the withstand voltage of the thin-film transistor small in Lg is allowed, and the voltage more than the bit line voltage and less than the word line voltage is used, whereby the speeding up of the precharge operation of each bit line can be performed.

As described above, the short MOS transistor of the precharge circuit section, which is disposed within the shared MOS transistor, is disposed outside the shared MOS transistor, on resistance of the shared MOS transistor is caused to disappear upon the precharge operation, thereby making it possible to speed up the precharge operation. The short MOS transistor lowers the gate voltage used as the startup signal from the word line voltage VPP level to the bit line voltage VDD level to thereby enable a reduction in power consumption. Further, the thin-film MOS transistor of those formed in the two-type gate oxide film process is used for the short MOS transistor in order to increase the current Ids at the startup of the short MOS transistor, and the shape thereof is also laid out by using the phase shift mask to thereby provide Lg much thinner than the sense amplifier, whereby the precharge operation is speeded up.

Figure 13:
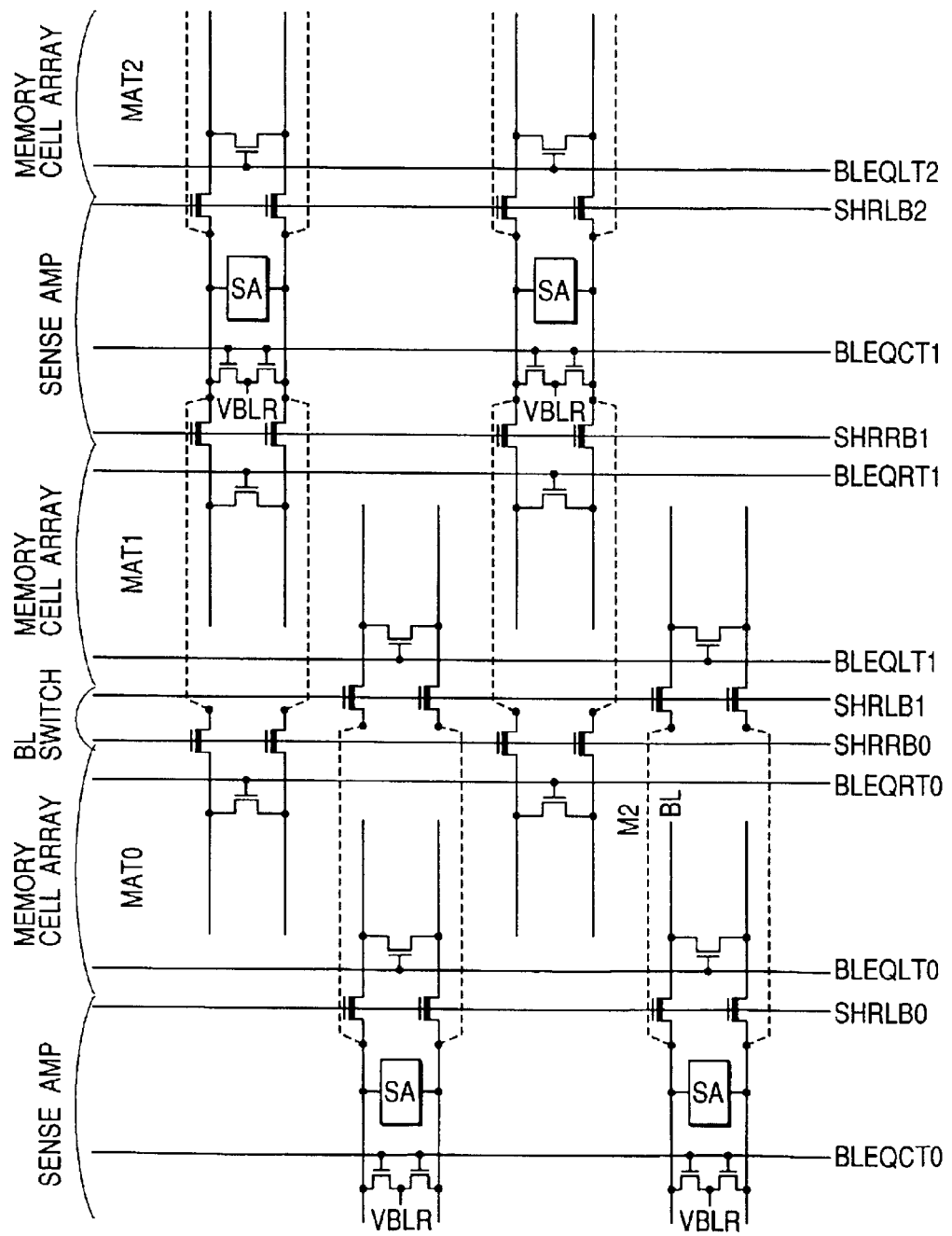
FIG. 13 is a fragmentary circuit diagram showing another embodiment of a memory cell array section employed in a dynamic RAM according to the present invention.

A fragmentary circuit diagram of another embodiment of a memory cell array section employed in a dynamic RAM according to the present invention is shown in FIG. 13. Bit lines employed in the present embodiment are configured as hierarchized bit lines. Namely, four pairs of complementary bit lines are respectively provided in bit-line extending directions with being centered on sense amplifiers SA. Two pairs of first and second complementary bit lines are disposed at both ends of the sense amplifier SA as described above. Third and fourth complementary bit lines are further extended in the same directions as the first and second complementary bit lines at both far ends of the first and second complementary bit lines as viewed from the sense amplifier SA side. Thus, the third and fourth complementary bit lines provided at their corresponding positions away from the sense amplifier SA are connected to their corresponding input/output nodes of the sense amplifier by upper metal wirings (M2 wirings) represented by dotted lines in the same drawing.

Namely, the upper wiring layers indicated by the dotted lines as described above cause upper portions of the first and second complementary bit lines to extend along the upper wiring layers at the input/output nodes of the sense amplifier SA. Shared selection MOSFETs are provided adjacent to the far ends of the first and second complementary bit lines, and the third and fourth complementary bit lines are respectively provided through such MOSFETs.

The sense amplifiers SA are respectively alternately disposed on both sides of memory cell arrays each comprising two pairs of complementary bit lines extended in the direction identical to the above. Complementary bit lines corresponding to two rows are disposed with respect to one sense amplifier SA, and memory cells are disposed in the corresponding memory cell array in the high density. Namely, if the memory cell array is as the center, the sense amplifiers SA are alternately provided on both sides thereof, and the two pairs corresponding to the half of the complementary bit lines provided in four pairs in total, which are connected to the sense amplifiers SA, are provided for such a memory cell array. Shared selection MOSFETs and short MOSFETs for performing precharge operations, which are associated with the third and fourth complementary bit lines disposed at positions distant as viewed from the sense amplifier SA, are provided at an intermediate portion of the memory cell array as viewed in a bit-line direction.

The memory cell arrays are provided in plural form in a bit-line extending direction. Except for memory cell arrays provided at both ends, the sense amplifiers are used to amplify read signals on the complementary bit lines corresponding to the four pairs in total, which are provided by two pairs in the memory cell arrays disposed on both sides with the sense amplifiers interposed therebetween respectively. In FIG. 13, a memory mat MAT0 corresponds to a memory cell array at the left end. Sense amplifiers SA provided on the left side thereof are provided only with two pairs of hierarchized bit lines corresponding to the memory mat MAT0.

Such bit-line hierarchizing is adopted for a high-speed and large-capacity array like a mixed DRAM to be described later. In such a mixed DRAM product, the number of bits, i.e., the number of memory cells (bit line length) connected to one bit line is reduced as compared with a general-purpose DRAM to reduce the load on each bit line. Thus, the parasitic capacity of the bit line is reduced, a read signal potential difference corresponding to an electrical charge read from each memory cell increases, and the load on each sense amplifier is lightened, thereby making it possible to perform a high-speed read operation.

In order to minimize a delay when a sub mat at the far end of the corresponding sense amplifier SA is precharged, bit lines on the sub mat at the far end of the sense amplifier are connected by the sense amplifier SA and such metal wirings M2 as indicated by the dotted lines, so the capacitance (and resistance) of each metal wiring M2 increase as compared with a sub mat at the near end of the sense amplifier. This will cause a speeding up of the time required to amplify the read signal on each bit line and a speeding up of a precharge time. In order to prevent it, short MOS transistors are disposed at a bit line switch section. A circuit configuration free of the influence of on resistance of each shared MOS transistor upon precharge can be taken, so that the speeding up of precharge can be maintained.

Figure 14:
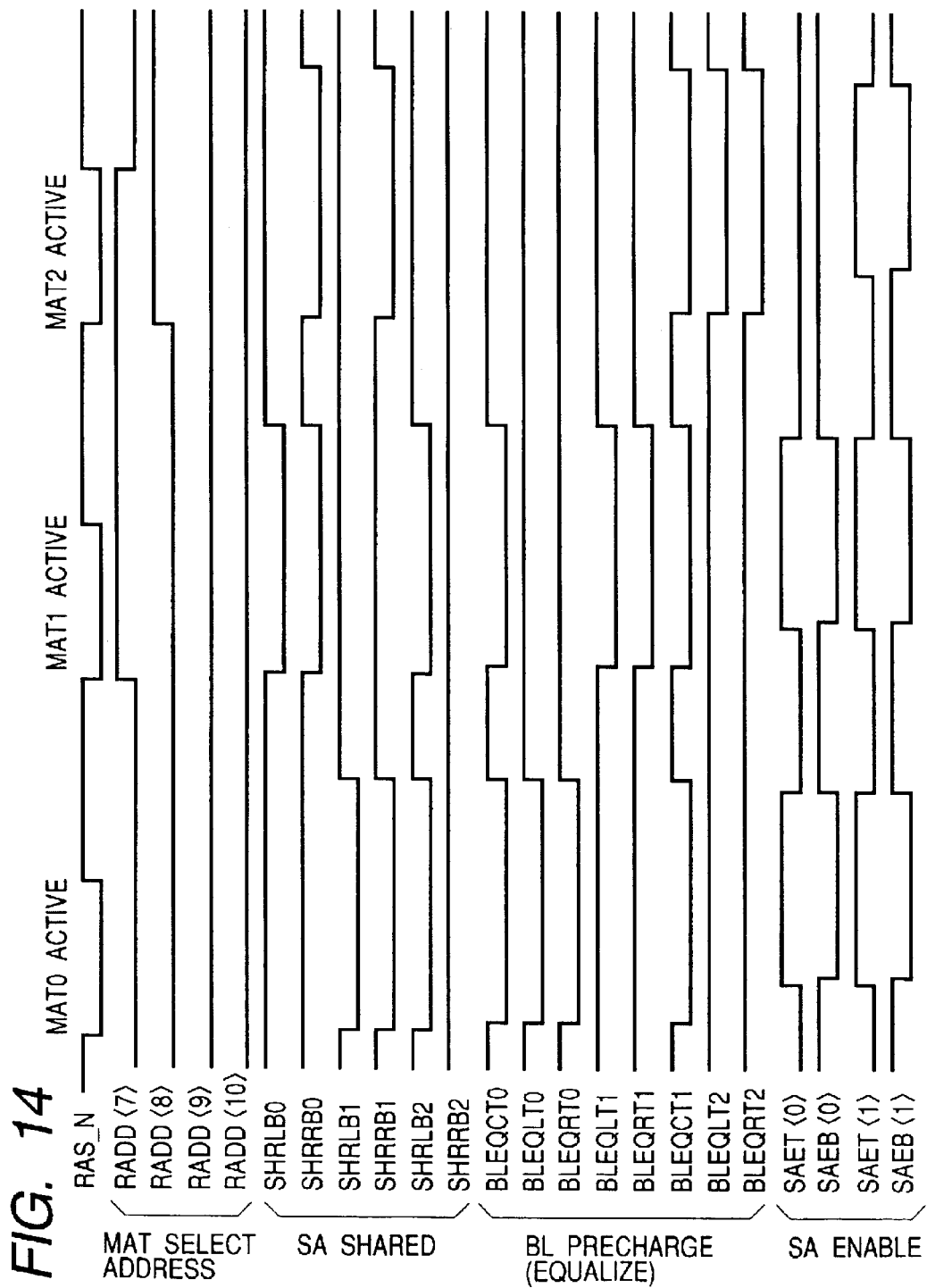
FIG. 14 is a timing diagram for describing one example of the operation of the dynamic RAM shown in FIG. 13.

A timing diagram for describing one example of the operation of the dynamic RAM shown in FIG. 13 is shown in FIG. 14. An example in which the memory mats MAT0, MAT1 and MAT2 are sequentially rendered active, is shown in the same drawing. Memory mats corresponding to sixteen in total are selectable by four bits of mat select addresses RAD<7> through <10>. As to the three memory mats shown in FIG. 13, of these, the memory mat MAT0 is taken active (brought to a selected state) when the RAD<9> and <10> are low in level, and the RAD<7> and <8> are both low in level, the memory mat MAT1 is taken active when the RAD<7> is high in level and the RAD<8>, <9> and <10> are low in level, and the memory mat MAT2 is taken active (selected state) when the RAD<7> and <8> are high in level and the RAD<9> and <10> are low in level.

When the memory mat MAT0 is taken active, the sense amplifiers SA placed on both sides thereof are activated. In order to activate the sense amplifiers SA, signals SAET<0> and SAEB<0>, and SAET<1> and SAEB<1> for activating the sense amplifiers disposed on both sides of the memory mat MAT0 are generated as SA enable signals. Here, SAET corresponds to the SAEN for bringing the N channel MOSFETs to the on state, and SAEB corresponds to the SAEP for bringing the P channel MOSFETs to the on state.

As to SA shared switch select signals, signals SHRLB0 and SHRRB0 still remain at high levels such that complementary bit lines of the memory mat MAT0 are connected to their corresponding input/output nodes of the sense amplifiers SA. Other SA shared switch select signals are respectively brought to a non-select level corresponding to a low level, and complementary bit lines associated therewith are disconnected from the sense amplifiers SA.

In a correspondence to the relationship of connection between such complementary bits lines and sense amplifiers SA, signals BLEQCT0 and BLEQCT1 of precharge MOSFETs provided in the sense amplifier units or sections on both sides of the memory mat MAT0, and signals BLEQLT0 and BLEQRT0 of precharge MOSFETs for short-circuiting the complementary bit lines disposed in the memory mat MAT0 are respectively taken low in level. Signals BLEQLT1, BLEQRT1, BLEQLT2 and BLEQRT2 of precharge MOSFETs for short-circuiting complementary bit lines disposed in the non-selected memory mats MAT1 and MAT2 respectively remain at a high level. Here, the signal BLEQCT corresponds to the signal PCH, and the signal BLEQ corresponds to the signal SH.

According to an unillustrated row-system select timing end signal, the corresponding word line is brought to a non-selected level to disconnect the corresponding memory cell from the complementary bit lines, so that the SA enable signal is reset to bring the corresponding sense amplifier to a non-operating state. Thus, the SA shared signal is reset to a high level to generate the BL precharge (equalize) signal, whereby the complementary bit lines brought to the high level/low level according to the amplifying operation of the corresponding sense amplifier SA are respectively set to a half precharge voltage at high speed according to the turning on of the short MOSFET. The precharge MOSFETs provided in the sense amplifier section principally carry out the operation of compensating for a reduction in precharge voltage formed by the short-circuiting operation due to a leak current.

When the memory mats MAT1 and MAT2 are rendered active subsequently, the relationship of connection between their complementary bit lines and sense amplifiers SA is determined by the SA shared signals and BL precharge signals in response to it. Thus, the sense amplifiers corresponding to the memory mats taken active are activated by their corresponding SA enable signals.

Figure 15:
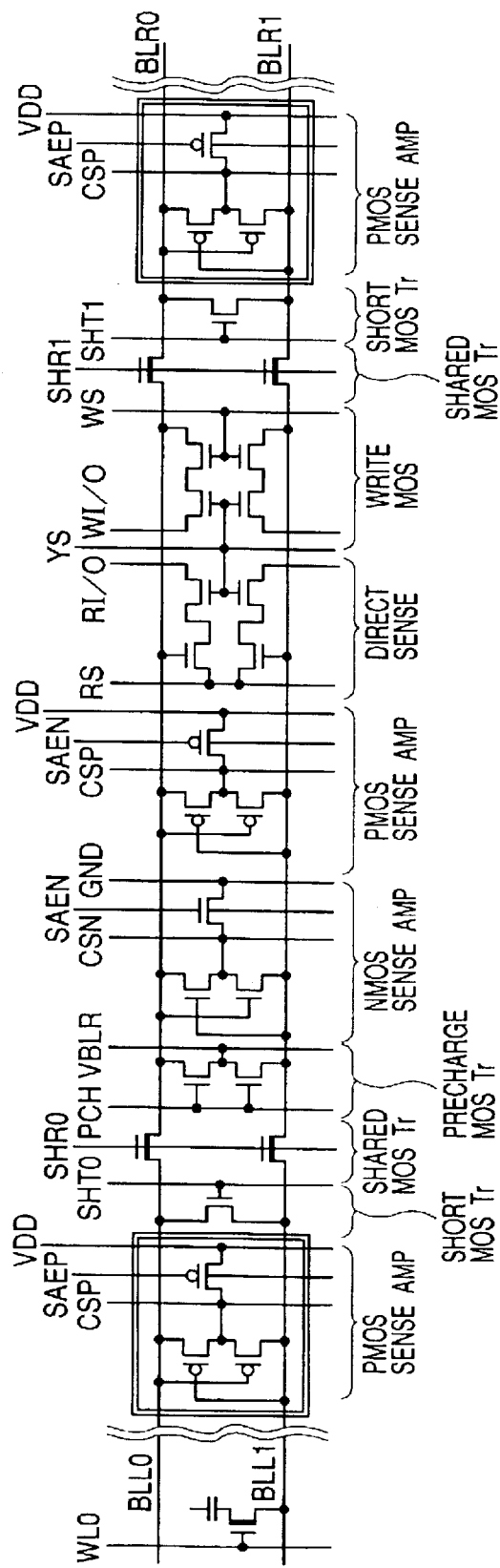
FIG. 15 is a fragmentary circuit diagram showing a further embodiment of a memory cell array section employed in a dynamic RAM according to the present invention.

A fragmentary circuit diagram showing a further embodiment of a memory cell array section employed in a dynamic RAM according to the present invention is shown in FIG. 15. In the present embodiment, PMOS sense amplifiers are disposed even outside shared MOS transistors respectively. Owing to such a configuration, the influence of on resistance of each shared MOS transistor is avoided even upon amplification of each sense amplifier. Directly connecting short MOS transistors and the PMOS sense amplifiers to their corresponding complementary bit lines of the memory cell array section in this way makes it possible to avoid the influence of the on resistance of each shared MOS transistor from both a precharge time for rate-controlling a high-speed operation of a memory cell periphery, and the time required to amplify an amplification "H" signal, whereby a further speedup can be achieved.

Figure 16:
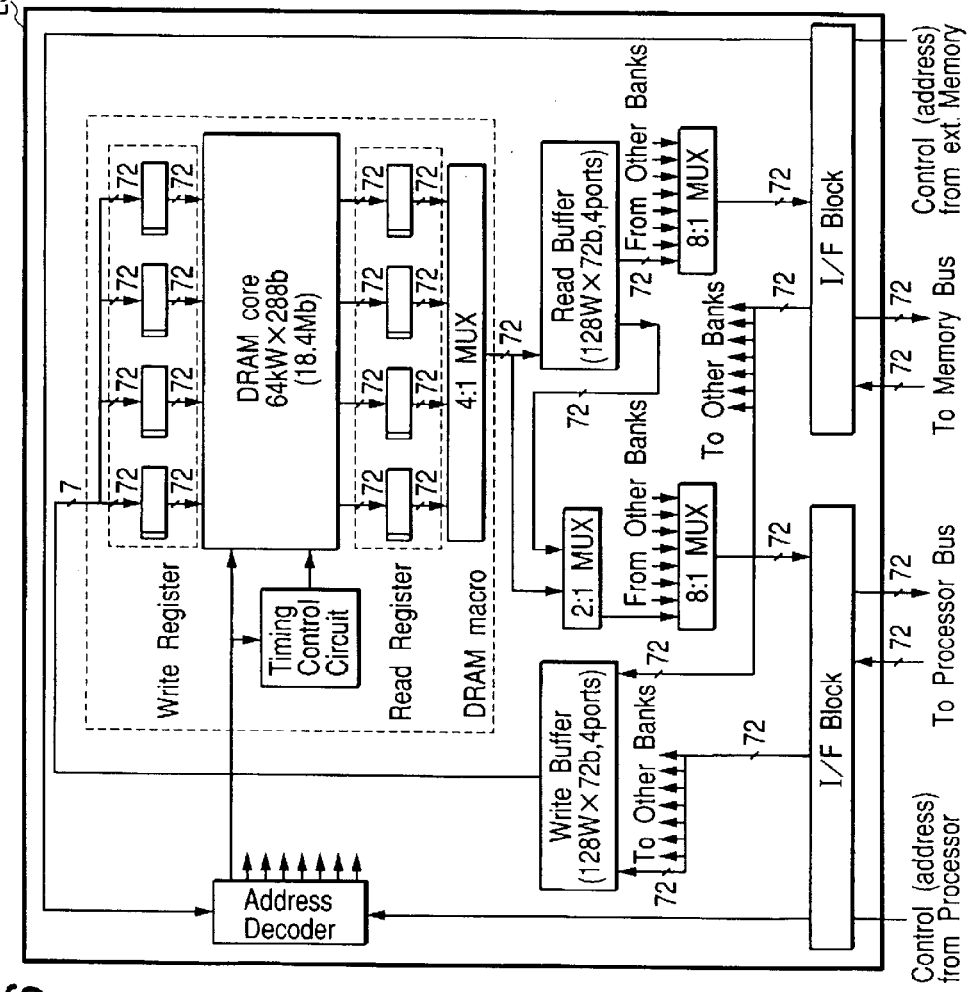
FIG. 16 is a block diagram illustrating one embodiment of a semiconductor integrated circuit device according to the present invention.

A block diagram of one embodiment of a semiconductor integrated circuit device according to the present invention is shown in FIG. 16. The LSI according to the present embodiment is a so-called mixed DRAM and comprises a DRAM macro (macro) and peripheral circuits for controlling it. The DRAM macro comprises a DRAM core (core), a timing control (Timing Control Circuit) circuit for performing its timing control, a write register (Write Register), a red register (Read Register), and a multiplexer MUX.

Although not restricted in particular, the LSI according to the present embodiment is used as a cache memory. An external interface of the LSI includes an interface block (I/F Block) corresponding to a processor, and an interface block (I/F Block) corresponding to a memory. A write buffer (Write Buffer), a read buffer (Read Buffer) and multiplexers MUX are provided in association with the two interface blocks. Although not restricted in particular, the write buffer and read buffer are respectively made up of a static RAM, and the multiplexers and the like are respectively constituted of a logic circuit formed of a gate array or the like.

Figure 17:
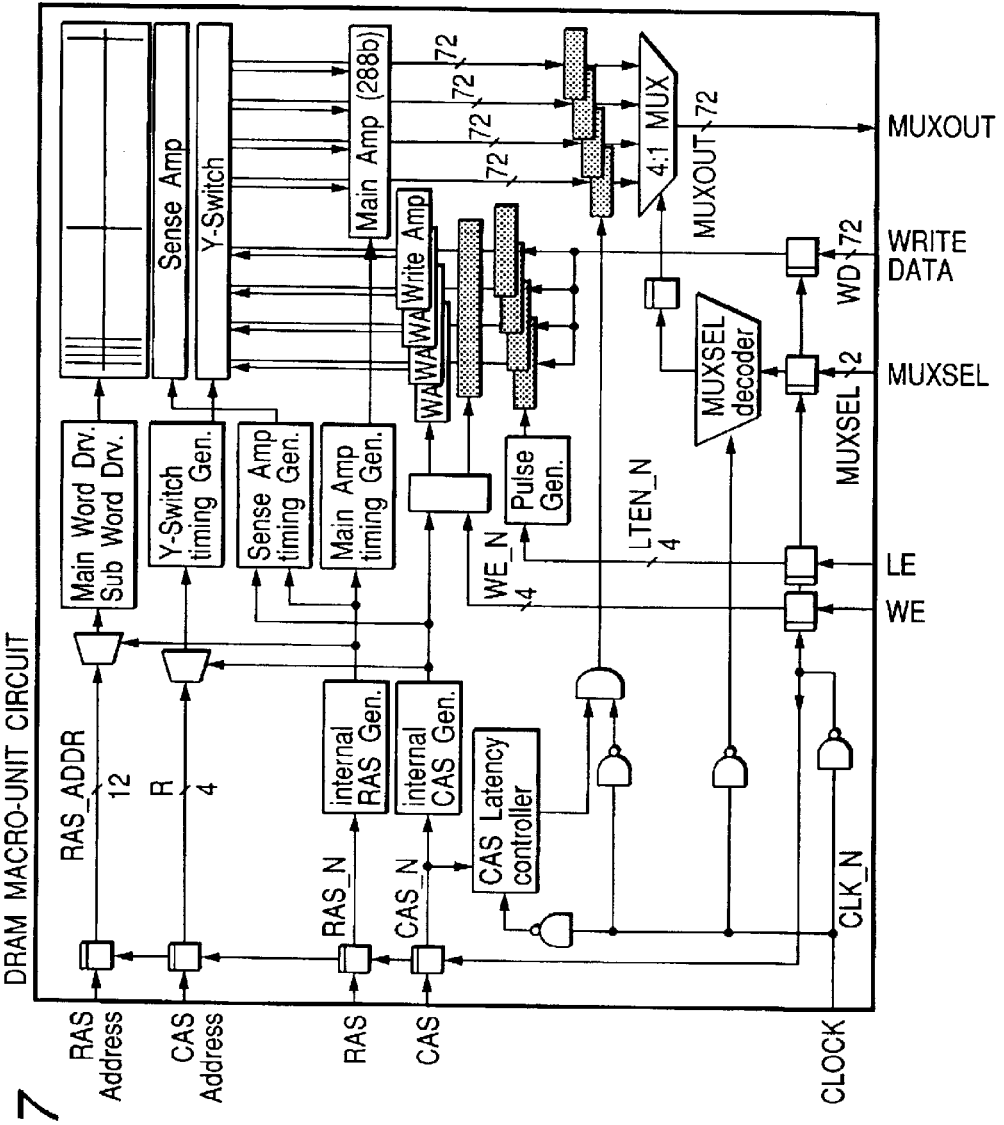
FIG. 17 is a block diagram showing one embodiment of a DRAM macro in FIG. 16.

A block diagram of one embodiment of the DRAM macro shown in FIG. 16 is shown in FIG. 17. In the present embodiment, data are read in 288-bit units from a DRAM memory array through a main amplifier (Main Amp) and stored in their corresponding registers in 72-bit units. The multiplexer MUX selects one register and outputs the data to the read buffer. Write data are inputted in units of 72 bits and retained in their corresponding registers correspondingly. Write amplifiers respectively retain read data in 288-bit units and selectively replace the 72-bit unit data retained in the registers. Although the data are written in the units of 288 bits in unison upon a write operation, the registers are respectively capable of rewriting the data in the units of 72 bits.

In order to select each word line of a memory cell array of a hierarchical word-line system, a word line selection circuit is provided with a main word line selection circuit (Main Word Drv), and a sub word line selection circuit (Sub Word Drv). Such a sense amplifier (Sense Amp) and column selection circuit (Y-Switch) as described above are provided for the memory cell array. For the operations of these selection circuits, respective circuits (RAS Gen, CAS Gen), etc. for supplying address signals and operating timing signals are provided.

As described above, precharge circuits (short MOS transistors) are disposed outside shared MOS transistors to thereby make it possible to speed up or increase a precharge time. The short MOS transistors are configured as thin-film transistors formed of two-type gate oxide films so as to serve as linear gate circuits on a layout basis. Thus, since a phase shift mask can be used, gate processing dimensions thinner than those of other gates (sense amps) can be realized.

A start signal (gate voltage) of each short MOS transistor can be set to a range in which its withstand voltage is allowed at a bit line voltage level or at greater than the bit line voltage level and less than a word line voltage level. Upon a precharge operation, Ids increases to enable an increase in precharge speed without the need for gate boost, and power consumption caused by a booster or step-up circuit can be reduced. Since a mat activation rate reaches 20 times that of the general-purpose DRAM in the case of the DRAM mixed in such a semiconductor integrated circuit device as shown in FIG. 16 in particular, an increase in precharge speed without the need for the gate boost upon the precharge operation becomes extremely beneficial.

Figure 18:
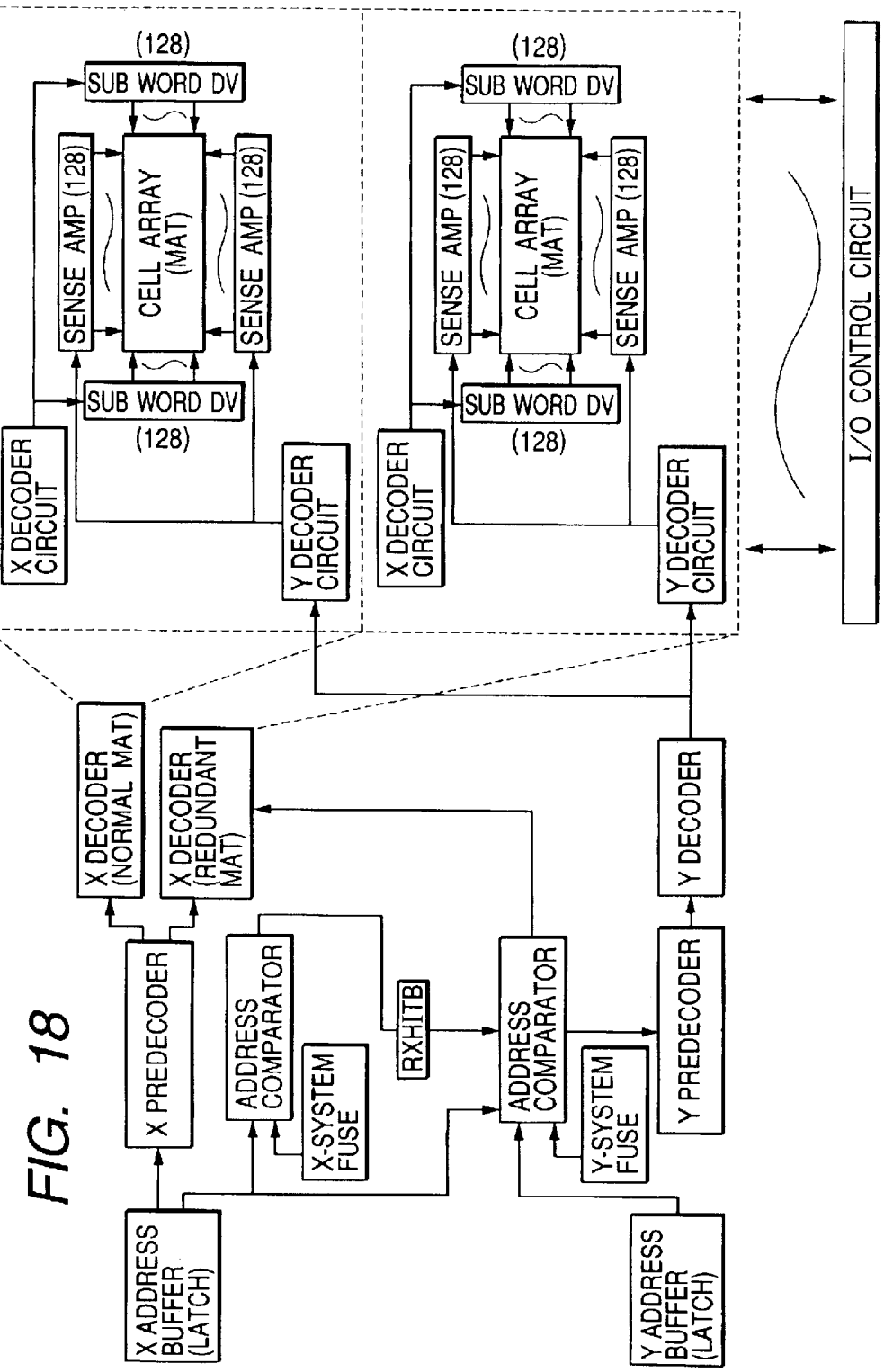
FIG. 18 is a block diagram illustrating one embodiment of a DRAM macro cell shown in FIG. 17.

A block diagram of one embodiment of the DRAM macro cell (memory bank) shown in FIG. 17 is shown in FIG. 18. Each memory bank is provided with X and Y address buffers or address latches. Thus, addresses can be supplied to one memory bank and continuously supplied to different memory banks independently of its memory operation. Namely, since the time is spent or taken until data is taken out from the input of each address in the DRAM, memory accesses are made to a plurality of the memory banks on a pipeline basis. Consequently, the time spent on a read operation of each individual memory bank can be set to zero apparently.

Although not restricted in particular in the present embodiment, the memory bank comprises a plurality of cell arrays. The cell arrays are provided in plural form in a word-line direction and a bit-line direction respectively. Although not restricted in particular, the cell array serves to select 256 sub word lines as a whole through 128 sub word drives (DV) provided on the left and right side (as viewed in a word-line extending direction) of the cell array. Dynamic memory cells are respectively disposed at portions where the 256 sub word lines and 256 pairs of bit lines intersect respectively, and are respectively amplified by sense amplifiers set on a 128-by-128 basis, which are provided up and down (in a bit-line extending direction). The sense amplifiers are respectively set as a shared sense amplifier system and commonly used in adjacent memory arrays. Similarly, the sub word DVs are also shared for selection of sub word lines of each adjacent memory array.

Although not restricted in particular, redundant arrays similar to the normal cell arrays are provided. Each of the redundant arrays includes 256 redundant word lines and 256 pairs of redundant bit lines like such those as described above. In addition to such X and Y redundancy, each normal sub array is provided with redundant bit lines although not restricted in particular. Therefore, a failure in bit line can also be relieved within each normal cell array.

An X address taken in or brought to the X address buffer is decoded by an X predecoder on the one hand. In parallel with it, the X address is compared with a defective or fail address stored in an X-system FUSE (fuse) by an address comparator. A signal outputted from the X predecoder is supplied to each of an X decoder of a normal mat and an X decoder of a redundant mat. A Y address taken in the Y address buffer is compared with a fail address stored in a Y-system FUSE (fuse) by an address comparator. It is determined based on information on coincidence of the fail address of the X system and the fail address of the Y system whether the normal mat or redundant mat should be used. From the result of its determination, the operations of the X decoder and Y decoder, which correspond to either a relief by the normal mat or a relief by the redundant mat, are performed.

Figure 19:
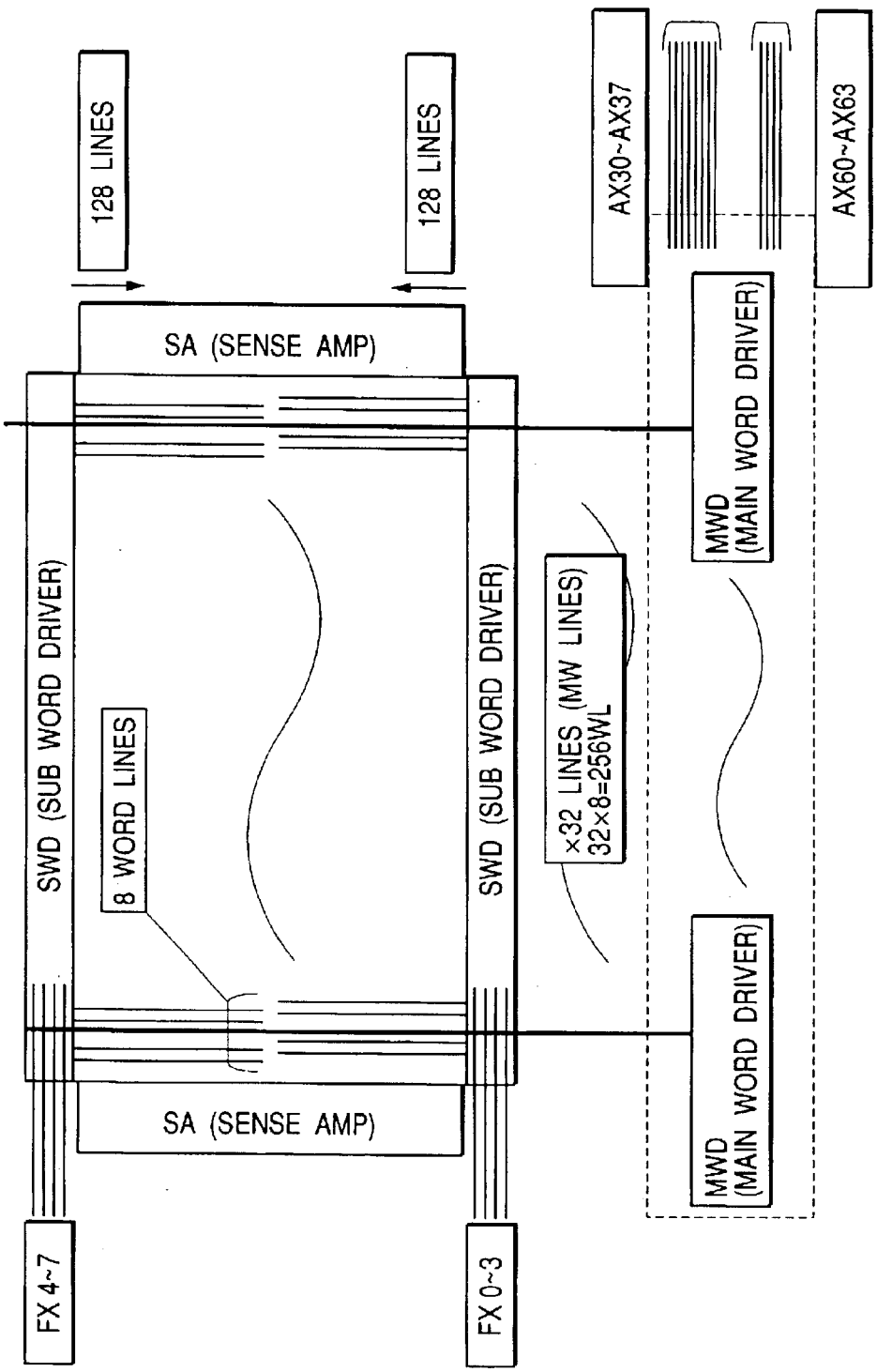
FIG. 19 is a block diagram depicting one embodiment of a cell array shown in FIG. 18.

A block diagram of one embodiment of a cell array shown in FIG. 18 is illustrated in FIG. 19. The same drawing shows a layout diagram of word lines. Each main word driver MWD forms a signal for selecting each main word line extended so as to penetrate a memory cell array constituting one memory bank corresponding to it. The cell array is formed so as to be surrounded by sense amplifiers SA and sub word drivers SWD. Although not restricted in particular, one cell array (sub array) includes sub word lines as 256, and complementary bit line pairs intersecting them are provided as 256 pairs.

The number of word lines (sub word lines) with respect to one main word line is assigned eight. Since the cell array is provided with the 256 word lines as described above, main word lines MWL like 256÷8=32 are provided. The main word driver is supplied with predecode signals of 8 bits comprising AX30 through AX37, and predecode signals of 4 bits comprising AX60 through AX63. According to combinations thereof, one of the 32 main word lines is selected by the corresponding main word driver MWD. Word line select signals FX0 through FX7 for selecting one from the word lines assigned to the one main word line eight by eight are provided. 3-bit X address signals or their decode signals are used to form the word line select signals FX0 through FX7.

The sub word driver SWD selects one word line (sub word line) in response to the select signal for the main word line and the word line select signals. The cell array is provided with the 256 word lines, and the 256 sub word drivers associated therewith are disposed on both sides in a distributed form 128 by 128. The word line select signals are also inputted with being divided into two groups like FX0 through FX3 and FX4 through FX7. Four of 0 to 3 of the eight sub word drivers provided in association with one main word line are disposed on one side and supplied with the select signals FX0 through FX3, and the remaining four of 4 through 7 thereof are disposed on the other side and supplied with the select signals FX4 through FX7, respectively.

In the present embodiment, the word lines provided in the cell array are shown so as to be cut off in the center of the cell array. This does not show that the word lines are electrically cut off in the center of the cell array. This is merely shown in simplified form in order to place emphasis on the fact that word lines (FG layers) connected with memory cells are cut off in a central portion with a view to achieving speeding up and high integration as will be described later.

Figure 20:
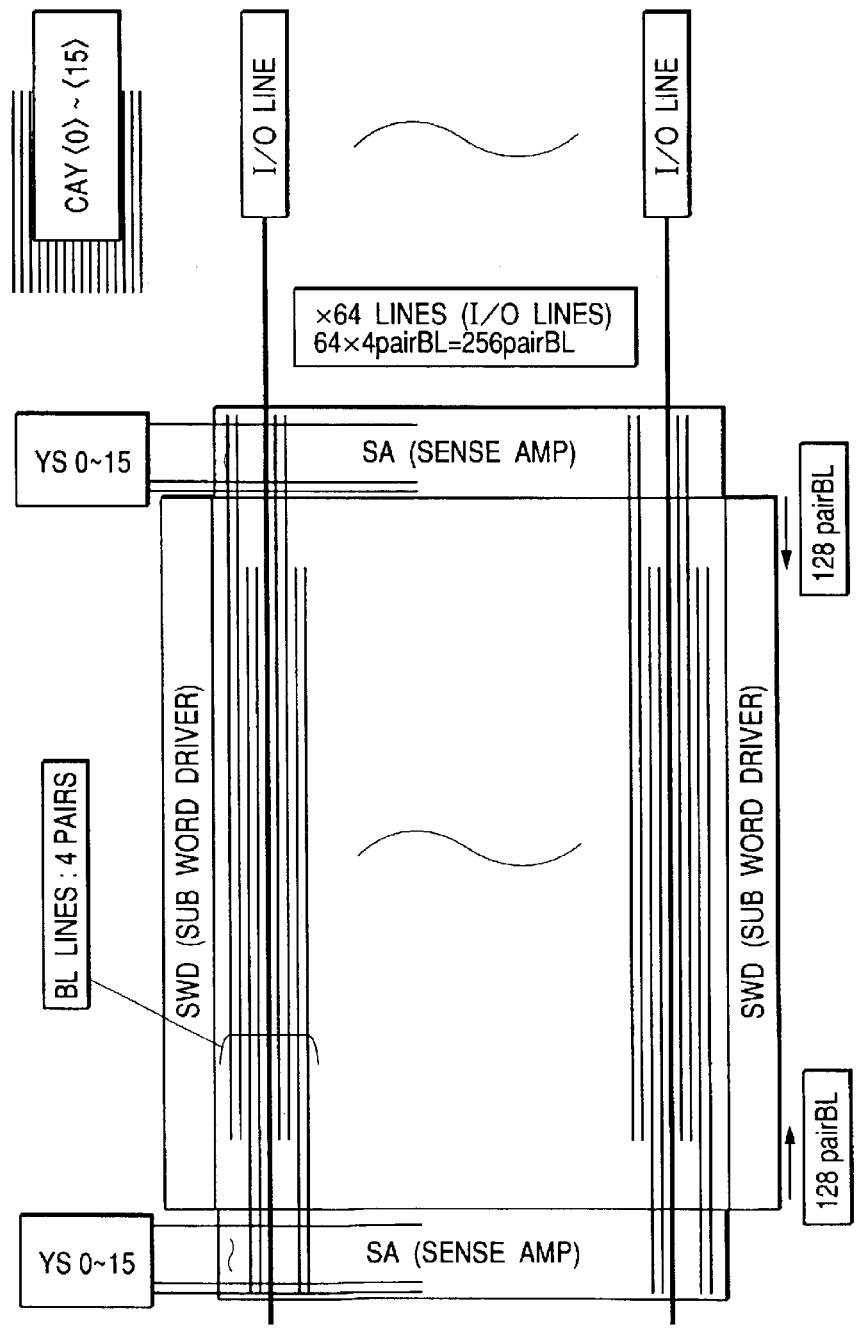
FIG. 20 is a block diagram showing one embodiment of the cell array shown in FIG. 18.

A block diagram of one embodiment of the cell array shown in FIG. 18 is illustrated in FIG. 20. The same drawing shows a layout diagram of bit line pairs. While the bit line pairs are constituted of 256 pairs, sense amplifiers SA are disposed on both sides of the cell array in distributed form in association with 128 pairs equal to one-half the 256 pairs. Further, 64 I/Os are extended in a bit line direction. One I/O indicated by a thick line comprises four pairs of signal lines and transfer signals on four pairs of bit lines. Column select signals YS0 through YS15 select four I/O lines. Namely, the two I/O lines are selected from one sense amplifier SA, and the two I/O lines are selected from the other sense amplifier SA. Since one I/O line is made up of the four pairs of signal lines, the input/output of 16-bit signals is enabled as a whole. Signals CAY(0) through CAY(15) are decode signals for forming the column select signals YS0 through YS15.

Although omitted in the same drawing because the drawing becomes complex, bit lines BL are also divided at an intermediate portion of the cell array to realize speeding up and high integration. A point of difference from the word lines resides in that the bit lines can be divided or cut even electrically owing to the provision of shared switches (or BL switches).

Figure 21:
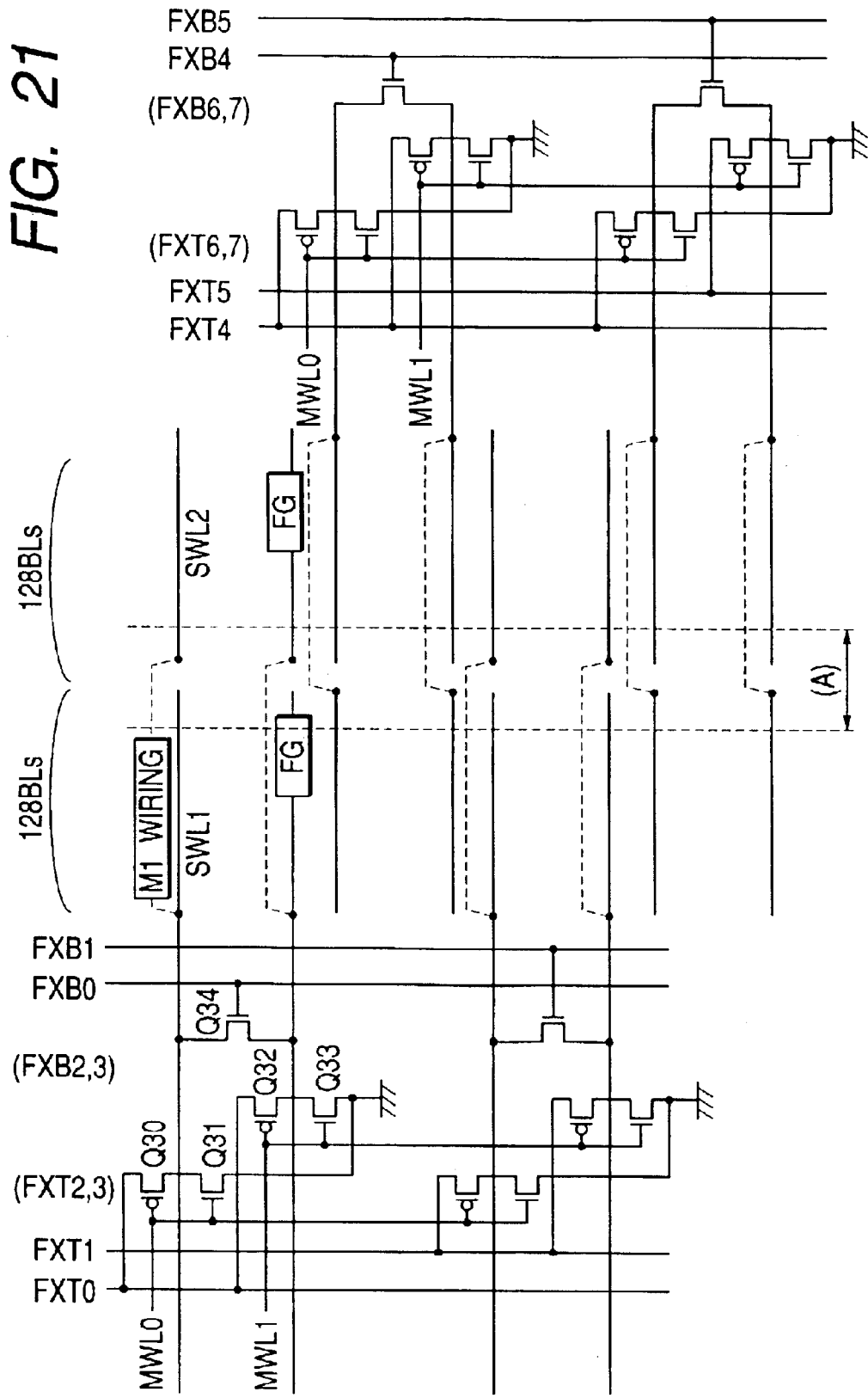
FIG. 21 is a circuit diagram illustrating one embodiment of the cell array shown in FIG. 19.

A circuit diagram of one embodiment of the cell array shown in FIG. 19 is illustrated in FIG. 21. Main word lines MWL0 and MWL1 are provided with sub word drivers corresponding to sixteen in total, which are arranged eight by eight. However, the four-by-four-arranged sub word drivers corresponding to eight in total, which are respectively associated with FX0 and FX1, and FX4 and FX5, are illustratively shown in the same drawing. The two sub word drivers of these, corresponding to the main word lines MWL0 and MWL1 and FX0 will be explained by way of example. The sub word drivers are made up of MOSFETs Q30 through Q34. In the same drawing, those marked with ○ indicative of inversion at gates means P channel MOSFETs respectively. The P channel MOSFETs are distinguished from N channel MOSFETs by such marks.

A P channel type MOSFET Q30 and an N channel type MOSFET Q31 constitute a CMOS inverter, and the gates thereof are electrically connected to the main word line MWL0. Similarly, a P channel type MOSFET Q32 and an N channel type MOSFET Q33 constitute a CMOS inverter, and the gates thereof are connected to the main word line MWL1. The drains of the P channel type MOSFETs Q30 and Q32 of the two sub word drivers, i.e., operation voltage terminals of the CMO inverters are commonly supplied with a word line select signal FXT0.

An N channel type MOSFET Q34 is provided between output terminals of the two sub word drivers, and the gate thereof is supplied with a word line select signal FXB0. In a manner similar to above subsequently, the main word lines MWL0 and MWL1 are used in common, and sub word drivers similar to the above are provided three sets (six in total) with respect to the respective word line select signals FX1, FX4 and FX5. The remaining eight sub word drivers associated with the word line select signals FX2 and FX3 and FX6 and FX7 are omitted.

The output terminal of the sub word driver made up of the MOSFETs Q30 ad Q31 is connected to one end of a first sub word line SWL1 formed of an FG layer. The other end of the first sub word line SWL1 extends to an intermediate portion of the cell array, where it is terminated. Therefore, while the cell array is provided with 256 pairs of bit lines BL as described above, the first sub word line SWL1 is disposed so as to intersect the 128 pairs of bit lines corresponding to the half thereof. Accordingly, 128 memory cells are connected to the first sub word line SWL1.

The output terminal of the sub word driver extends in parallel with the first sub word line SWL1 and is connected to one end of an M1 wiring. The other end of the M1 wiring is connected to one end of a second sub word line SWL2 which extends in an extending direction of the first sub word line SWL1. The second sub word line SWL2 is made up of an FG layer in a manner similar to the first sub word line SWL1. The second sub word line SWL2 extends from the intermediate portion of the cell array to the end of the cell array on the opposite side of the sub word driver and is disposed so as to intersect the remaining half 128 pairs of bit lines. Accordingly, 128 memory cells are connected even to the second sub word line SWL2.

Since the first sub word line SWL1 and the second sub word line SWL2 are interconnected with each other through the M1 wiring, one sub word driver enables the 256 memory cells to be set to selected states. Since, however, the M wiring can be set to a low resistance value as compared with the sub word line SWL1 formed of the FG layer, each sub word driver is caused to have sufficient current drive capacity, so that the memory cell at the far end of the sub word line SW and the memory cell at the far end of the sub word line SWL2 can be substantially equal to each other in select delay time.

In other words, as compared with a delay time spent on the selection of each memory cell at a far end where 256 memory cells are connected to a sub word line formed of an FG layer, each of delay times spent on the selection of the memory cells at far ends of the two sub word lines SWL1 and SWL2 can be brought to half by division of the sub word lines into the two sub word lines SWL and SWL2 connected with the 128 memory cells as described above if output impedance of each sub word driver is ignored.

If the number of memory cells connected to each sub word line is reduced like 128, then the time required to select each memory cell can be speeded up or accelerated in a manner similar to above. However, the number of divisions of the cell array increases and the number of the sub word drivers provided in the word line direction increases even twice. Therefore, the overall area of the memory cell array increases. In the present embodiment, the sub word lines each formed of the FG layer are cut at the intermediate portion of the cell array, and the select signal for each sub word driver is transferred to its corresponding sub word line SWL2 disposed far away from the sub word driver through the M1 wiring low in resistance disposed in parallel with the sub word line SWL1 disposed near the sub word driver, whereby the number of the memory cells connected to the sub word liens as described above can be equivalently reduced to half, thus making it possible to achieve high integration.

The operation of selecting the sub word lines SWL1 and SWL2 is as follows: When the main word line MWL0 is brought to a selected state corresponding to a low level, and the word line select signal FXT0 is brought to a selected state corresponding to a high level, the P channel type MOSFET Q30 is brought to an on state to transfer the high level of the word line select signal FXT0 to the sub word lines SWL1 and SWL2. In each sub word driver corresponding to the non-selected main word line MWL1, the N channel type MOSFET Q33 is brought to an on state to set its corresponding sub word line to a non-selected level corresponding to a low level. At this time, the MOSFET Q34 is held off in response to a low level of FXB0. When the word line select signal FXT0 is in the selected state corresponding to the high level, the main word line MWL0 takes a high level corresponding to non-selection, and the main word line MWL1 is at a low level corresponding to selection, the adjacent sub word line is selected.

When the main word line MWL0 is brought to the selected state of the low level and the word line select signal FXT0 is in a non-selected state corresponding to a low level, the P channel MOSFET Q30 is held on. However, the threshold voltage of the P channel type MOSFET Q30 remains in the word line select signal FXT0 and hence the word line select signal cannot be set to a low level like a ground potential. At this time, the MOSFET Q34 is held on in response to a high level of FXB0. Thus, a low level formed in a state in which the N channel type MOSFET Q33 of the sub word driver corresponding to the non-selected main word line MWL1 is on, is transferred to the sub word lines SWL1 and SWL2. At this time, other sub word lines are brought to a selected state by any of the word line select signals FX1 (FXT1 and FXB1) through FX7 (FXT7 and FXB7).

Figure 22:
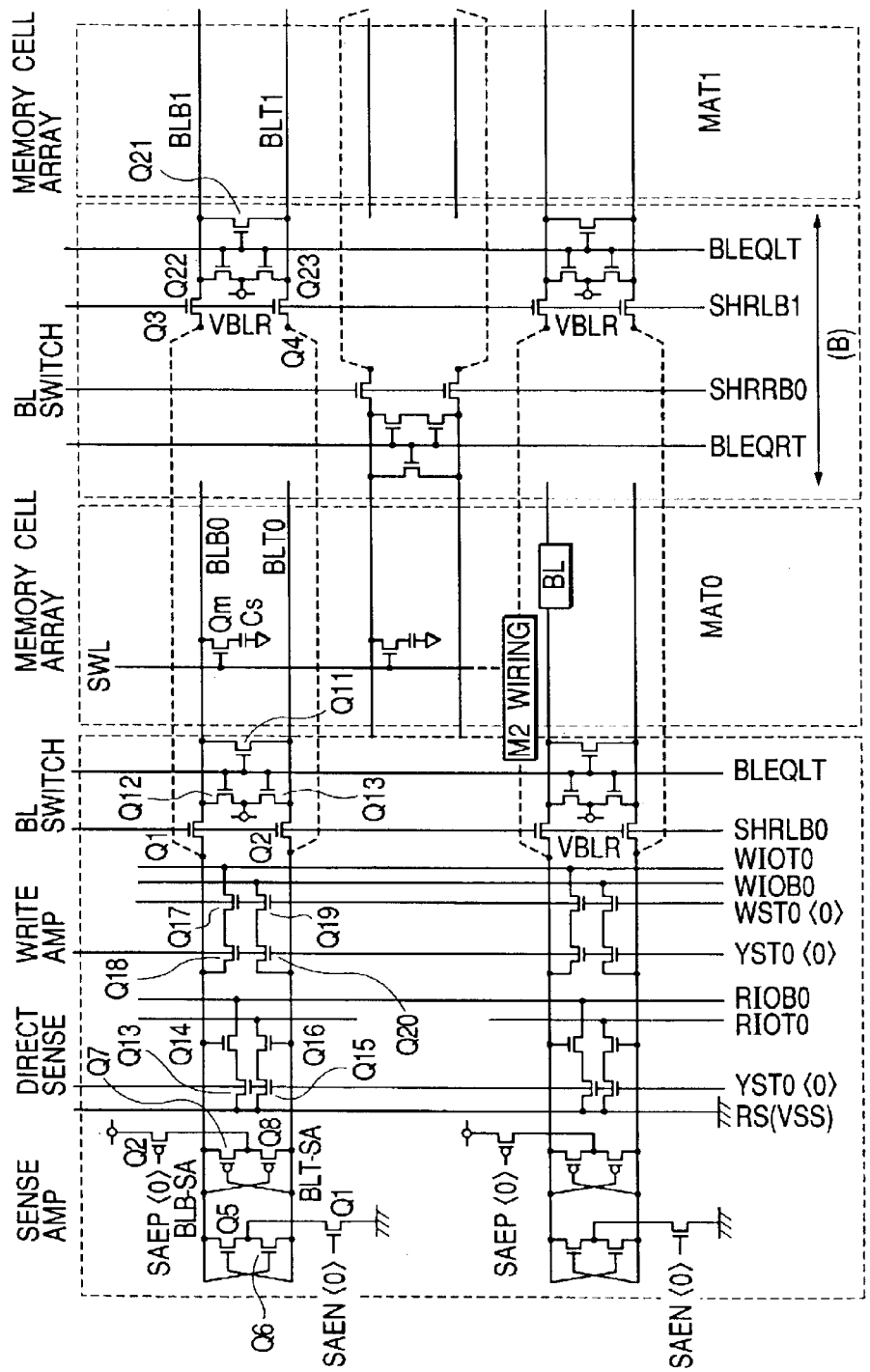
FIG. 22 is a circuit diagram showing one embodiment of the cell array shown in FIG. 20.

A circuit diagram of one embodiment of the cell array shown in FIG. 20 is illustrated in FIG. 22. In the same drawing, two sense amplifiers disposed as typical, and bit line pairs, a precharge circuit, a read-system circuit and a write-system circuit, etc. related thereto are illustratively shown as representative ones. In the present embodiment, the memory cell array is divided into two memory mats MAT0 and MAT1. As illustratively shown in the memory mat MAT0, a dynamic memory cell (Memory Cell) comprises an address selecting MOSFET Qm and a storage capacitor Cs. The gate of the address selecting MOSFET Qm is connected to such a sub word line SWL0 as described above, and one of the source and drain of the MOSFET Qm is electrically connected to a bit line BLB0 of each bit line pair. The other thereof is electrically connected to a storage node of the information storage capacitor Cs. The other electrode of the information storage capacitor Cs is shared and supplied with a plate voltage.

As described above, the memory cell array is divided into the two memory mats MAT0 and MAT1, and their corresponding bit lines BLB0 and BLT0, and BLB1 and BLT1 are disposed in parallel as shown in the same drawing. The complementary bit lines BLB0 and BLT0 of the memory mat MAT0, which are disposed near the sense amplifier, are respectively connected to input/output nodes BLB-SA and BLT-SA by shared switch (or BL switch) MOSFETs Q1 and Q2. Shared switch (or BL switch) MOSFETs Q3 and Q4 provided at the complementary bit lines BLB1 and BLT1 of the memory mat MAT1, which are disposed far away from the sense amplifier, are respectively connected to the input/output nodes BLB-SA and BLT-SA of the sense amplifier through M2 wirings extended in parallel with the complementary bit lines BLB0 and BLT0. Namely, the memory cell array is divided into the two memory mats MAT0 and MAT1 by the BL switches provided in the center as viewed in a bit line direction.

A unit circuit constituting each sense amplifier comprises a CMOS latch circuit made up of N channel type MOSFETs Q5 ad Q6 and P channel type MOSFETs Q7 and Q8 whose gates and drains are respectively cross-connected to form a latch configuration. The sources of the N channel type MOSFETs Q5 and Q6 are supplied with a ground potential by provision of the corresponding sense amplifier activation MOSFET Q1. The sources of the P channel type MOSFETs Q7 and Q8 are supplied with an operating voltage by provision of the corresponding sense amplifier activation MOSFET Q2.

The gate of the sense amplifier activation MOSFET Q2 is supplied with a sense amplifier enable or activation signal SAEP, so that the sense amplifier activation MOSFET Q2 is brought to an on state in synchronism with a low level of the signal SAEP to thereby supply an operating voltage thereof to the sources of the P channel type MOSFETs Q7 and Q8. The gate of the sense amplifier activation MOSFET Q1 is supplied with a sense amplifier enable or activation signal SAEN, so that the sense amplifier activation MOSFET Q1 is brought to an on state in synchronism with a high level of the signal SAEN to thereby supply a circuit's ground potential to the N channel type MOSFETs Q5 and Q6.

The sources of the N channel type MOSFETs Q5 and Q6 are connected in common with the source of a similar MOSFET of another sense amplifier, and the sense amplifier activation MOSFET Q1 may be provided in common with respect to a plurality of sense amplifiers so as to supply the ground potential. The sources of the P channel type MOSFETs Q7 and Q8 are connected in common with the source of a similar MOSFET of another sense amplifier, and the sense amplifier activation MOSFET Q2 may be provided in common with respect to a plurality of sense amplifiers so as to supply an operating voltage.

A direct sense circuit constituting the read-system circuit and a write amplifier circuit constituting the write-system circuit are provided for the input/output nodes BLB-SA and BLT-SA of the sense amplifier. The direct sense circuit comprises N channel type MOSFETs Q13 through Q16. The write amplifier circuit comprises N channel type MOSFETs Q17 through Q20.

In the direct sense circuit, the amplifying MOSFETs Q14 and Q16 whose gates are connected to the input/output nodes BLB-SA and BLT-SA of the sense amplifier, and the MOSFETs Q13 and Q15 whose gates are connected to a column select line YST0<0>, are respectively connected in series. The drain of the amplifying MOSFET Q14 is connected to a complementary read signal line RIOB1, and the drain of the amplifying MOSFET Q16 is connected to a read signal line RIOT1. The sources of the MOSFETs Q13 and Q15 are supplied with the circuit's ground potential.

The write amplifier circuit comprises a series circuit of the MOSFETs Q17 and Q18 and MOSFETs Q19 and Q20, which is provided between the input/output nodes BLB-SA and BLT-SA of the sense amplifier and complementary write signal lines WIOB0 and WIOT0. The gates of the MOSFETs Q18 and Q20 each used as a column switch are connected to the column select line YST0. The gates of the MOSFETs Q17 and Q19 are connected to an operation timing signal line WST0<0>.

The sense amplifiers employed in the present embodiment are configured as so-called shared sense amplifiers wherein the complementary bit lines for the left and right memory cell arrays are provided by two pairs with respect to the input/output nodes BLB-SA and BLT-SA. Namely, in one memory cell array illustratively shown in the same drawing, the input/output nodes BLB-SA and BLT-SA are respectively connected to the closer bit lines BLB0 and BLT0 through the shared switch MOSFETs Q1 and Q2, and connected to the farther bit lines BLB1 and BLT1 through the M2 wirings and shared switch MOSFETs Q3 and Q4.

In the present embodiment, select signals SHRLB0 and SHRLB1 are respectively applied to the gates of the shared switch MOSFETs Q1 and Q2, and Q3 and Q4. Select levels of such select signals SHRLB0 and SHRLB1 are respectively brought to a high level like a step-up or boost voltage in a manner similar to a select level for each sub word line SWL or the like. Incidentally, a similar memory cell array is provided even for other sense amplifier. Further, the corresponding sense amplifiers are disposed on both sides of the memory cell array as viewed in a bit line direction. Bit lines adjacent to the bit lines BLB0 and BLT0, and BLB1 and BLT1 are connected to their corresponding unillustrated sense amplifiers adjacent to the memory mat MAT1.

A precharge circuit comprising switch MOSFETs Q12 and Q13 for supplying a half precharge voltage VBLR and a MOSFET Q11 for short-circuiting BLB0 and BLT0 is provided for the one complementary bit lines BLB0 and BLT0. The gates of these MOSFETs Q11 through Q13 are commonly supplied with a precharge signal BLEQLT. A precharge circuit comprising switch MOSFETs Q22 and Q23 for supplying a half precharge voltage VBLR and a MOSFET Q21 for short-circuiting BLB1 and BLT1 is provided for the other complementary bit lines BLB1 and BLT1. The gates of these MOSFETs Q21 through Q23 are commonly supplied with a precharge signal BLEQLT.

In the present embodiment, when the MAT0 of the memory cell array is selected as shown in the timing diagram of FIG. 14, the MOSFETs Q1 and Q2 are held on by the signal SHRLB0, and the signal SHRLB1 is brought to a low level to disconnect the bit lines BLB1 and BLT1 of the memory mat MAT1. The bit lines of the unillustrated other memory cell array may be disconnected or shut off similarly. However, when the MAT0 of the memory cell array is selected to achieve low power consumption as will be described using FIGS. 24 and 25 to be described later, the signal SHRLB0 may be raised from a low level like the circuit's ground potential to a select level corresponding to the boost voltage to thereby bring the MOSFETs Q1 and Q2 to the on state respectively.

Similarly, when the memory mat MAT1 is selected as shown in the timing diagram of FIG. 14, the MOSFETs Q3 and Q4 are held on by the signal SHRLB1, and the signal SHRLB0 is brought to a low level, so that the bit lines BLB0 and BLT1 of the memory mat MAT0 may be disconnected or shut off. However, when the MAT1 of the memory cell array is selected as will be described later, the signal SHRLB1 may be raised from the low level like the circuit's ground potential to the select level corresponding to the boost voltage to thereby bring the MOSFETs Q3 and Q4 to the on state respectively.

In such a shared-switch selecting system as shown in FIG. 14, the signals SHRLB0 and SHRLB1 and the signals corresponding to other memory cell array are also both taken high in level during a precharge period in which a memory access has been completed. In such a shared-switch selecting system as will be described later, the signals SHRLB0 and SHRLB1 and the signals corresponding to other memory cell array are also both taken low in level. Their bit lines are precharged by their corresponding precharge circuits provided therefor according to the signals BLEQLT.

In the present embodiment, the bit lines connected upon amplification of the corresponding sense amplifier result in only either the bit lines BLB0 and BLT0 or the BLB1 and BLT1 in the memory cell array selected by the above selecting operation. As a result, the number of the memory cells connected to the selected bit lines can be reduced to half like 128. Therefore, the parasitic capacity of each bit line is reduced and the rate between the parasitic capacity and the capacitance of the storage capacitor Cs of each memory cell can be reduced. In other words, the amount of change in the precharge potential of each bit line corresponding to an information charge of the storage capacitor Cs can be increased. Thus, the amount of signals inputted to the sense amplifier increases, and the sense amplifier can be speeded up and power consumption thereof can be reduced.

If the number of the memory cells connected to the bit lines is reduced like 128, then the speeding up and low power consumption of each sense amplifier can be achieved in a manner similar to the above. However, the number of divisions of a cell array increases and hence the number of sense amplifiers provided in a bit line direction is increased even twice. Therefore, the overall area of the memory cell array will increase. In the present embodiment, the bit lines formed of the BL layer are cut at the intermediate portion of the cell array, and the bit lines disposed far away from the sense amplifier are connected to the sense amplifier by the low-resistance M2 wirings disposed in parallel with the bit lines disposed near the sense amplifier to thereby enable the number of memory cells connected to the sense amplifier to be reduced to half as described above, whereby high integration is achieved.

Figure 23:
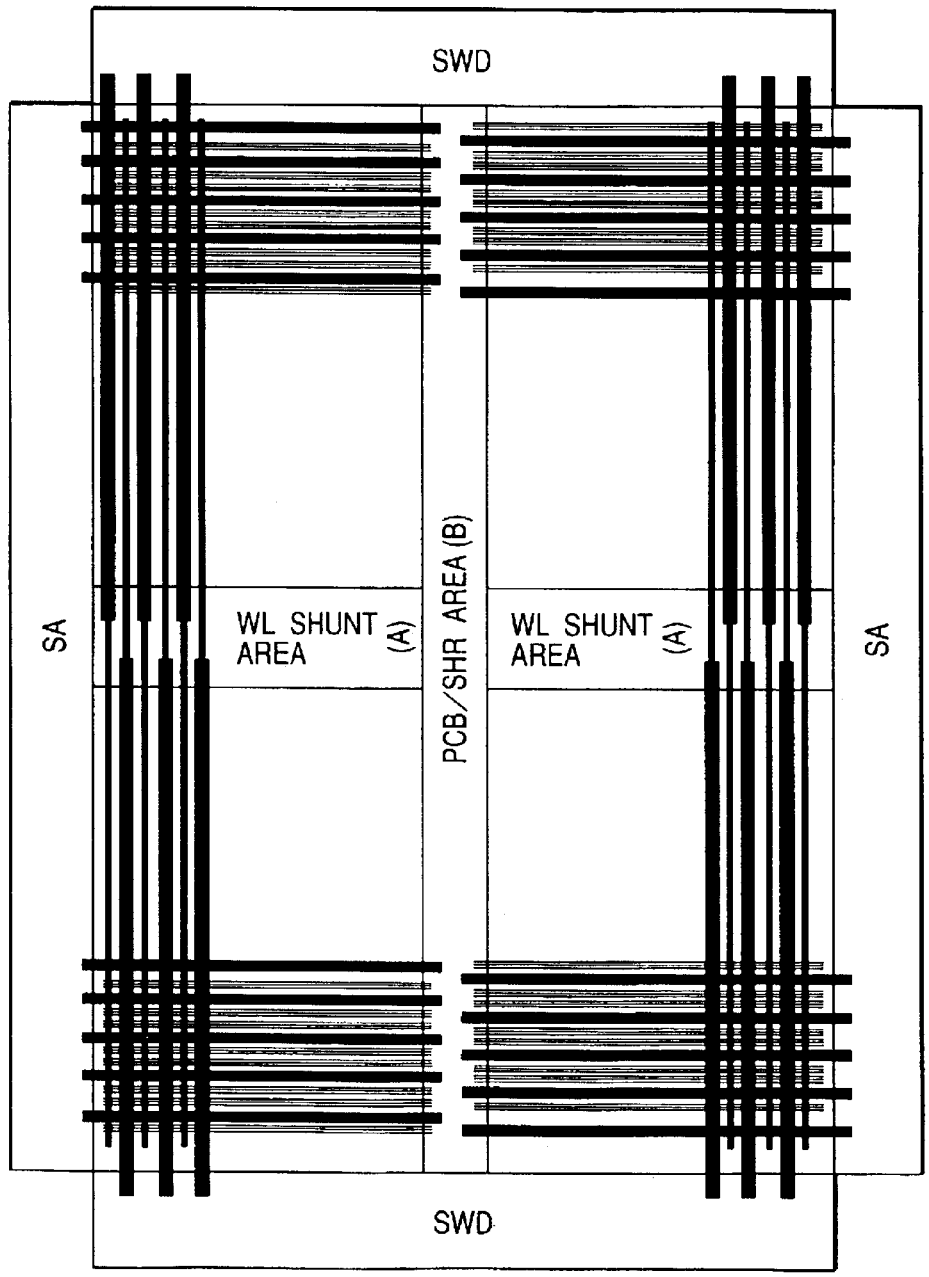
FIG. 23 is a layout diagram illustrating one embodiment of a memory cell array according to the present invention.

A layout diagram of one embodiment of a memory cell array according to the present invention is illustrated in FIG. 23. In the memory cell array, sense amplifiers SA are provided on both sides thereof as viewed in a bit line direction, and sub word drivers SWD are provided on both sides thereof as viewed in a word line direction. Thus, the memory cell array is configured with being surrounded by the sense amplifiers SA and the sub word drivers SWD. The memory cell array is provided with a precharge circuit and shared switch circuit PCH/SHR area (B) for dividing it into the memory mats MAT0 and MAT1 at an intermediate portion thereof as viewed in the bit line direction as shown in FIG. 22. The memory cell array is provided with such WL shunt areas (A) as shown in FIG. 21 at an intermediate portion thereof as viewed in the word line direction.

The bit lines are of the M2 wirings corresponding to ones indicated by thick lines and connected to their corresponding bit lines provided at their extended places. Divided half bit lines are provided even in layers below the M2 wirings. Word lines (sub word lines) are of M1 wirings corresponding to ones indicated by thick lines and connected to their corresponding sub word lines provided at their extended places. Divided sub word lines each having a half length are provided even in layers below the M1 wirings. Owing to such a configuration, one memory cell array (memory mat) is practically divided into four by the precharge circuit and shared switch circuit PCH/SHR area (B) and WL shunt areas (A), so that the speeding up of the above operation is enabled.

Figure 24:
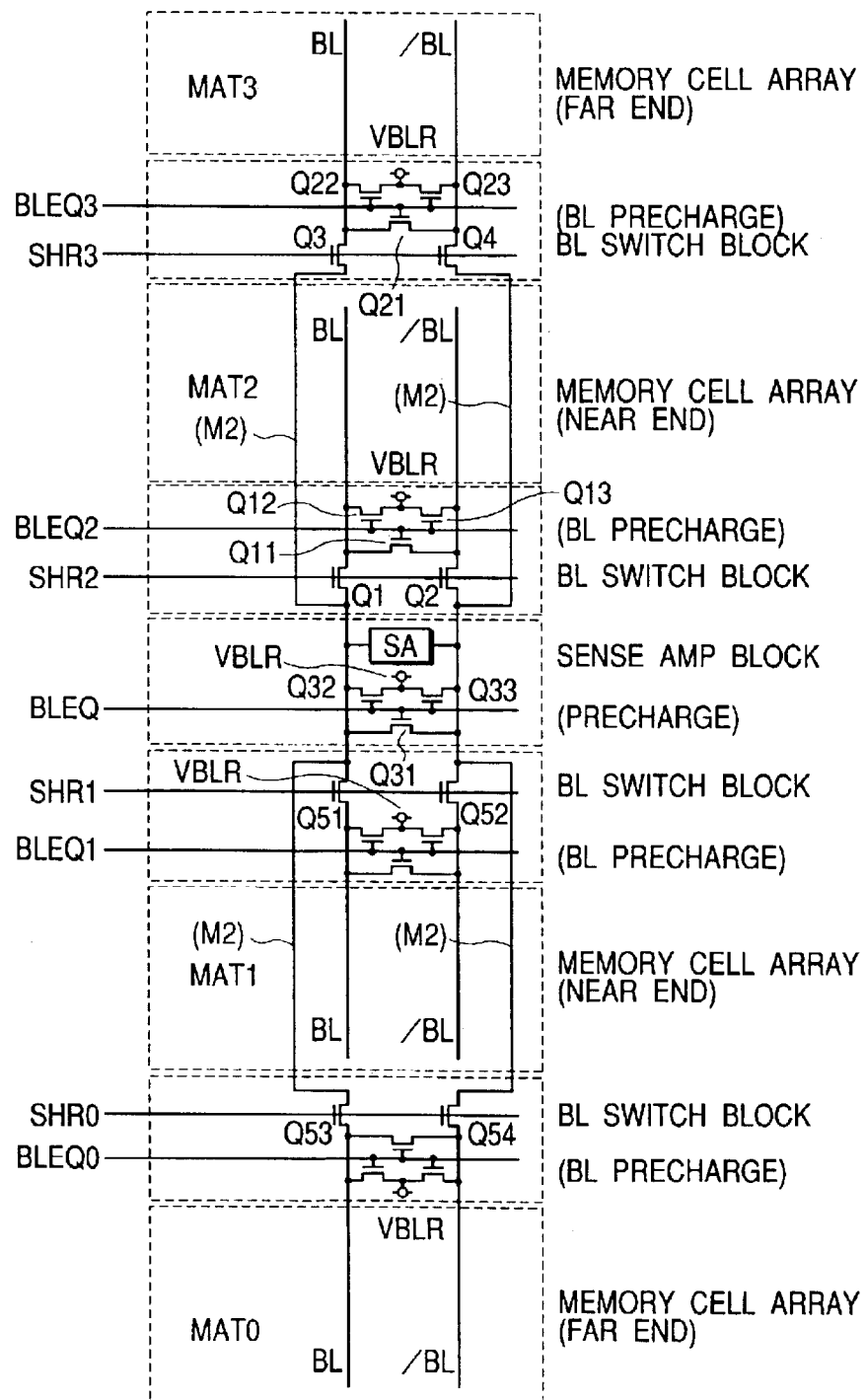
FIG. 24 is a circuit diagram depicting another embodiment of the memory cell array shown in FIG. 23.

A circuit diagram of another embodiment of the memory cell array shown in FIG. 23 is illustrated in FIG. 24. In the same drawing, one sense amplifier, and four pairs of complementary bit lines, precharge circuits and BL switches related thereto are illustratively shown as representative ones. In the present embodiment, memory mats MAT1 and MAT3 are disposed on both sides of the sense amplifier with the sense amplifier SA as the center. The memory mat MAT0 is disposed on the far end side of the complementary bit line pair of the memory mat MAT1 with the sense amplifier SA as the reference so as to interpose the memory mat MAT1 therebetween. The memory mat MAT3 is disposed on the far end side of the complementary bit line pair of the memory mat MAT2 with the sense amplifier SA as the reference so as to interpose the memory mat MAT2 therebetween.

A BL precharge circuit comprising a short MOSFET Q31 and precharge MOSFETs Q32 and Q33 for supplying a precharge voltage VBLR is provided at a pair of input/output nodes of the sense amplifier SA. The gates of the MOSFETs Q31 through Q33 are supplied with a precharge signal BLEQ.

The pair of input/output nodes of the sense amplifier SA is connected to the corresponding complementary bit lines BL and /BL of the memory mat MAT2 adjacent thereto on the upper side as viewed in the same drawing through select switch MOSFETs Q1 and Q2 switch-controlled by a select signal SHR2. A BL precharge circuit comprising a short MOSFET Q11 and precharge MOSFETs Q12 and Q13 for supplying a precharge voltage VBLR is provided at the bit lines BL and /BL of the memory mat MAT2. The gates of the MOSFETs Q11 through Q13 are supplied with a precharge signal BLEQ2.

The pair of input/output nodes of the sense amplifier SA is connected to the corresponding complementary bit lines BL and /BL of the memory mat MAT3 provided on the bit-line far end side of the memory mat MAT2 adjacent thereto on the upper side thereof through select switch MOSFETs Q3 and Q4 switch-controlled by a select signal SHR3. A metal wiring M2 connects between the input/output nodes and the select switch MOSFETs Q3 and Q4 in the same manner as described above. A BL precharge circuit comprising a short MOSFET Q21 and precharge MOSFETs Q22 and Q23 for supplying a precharge voltage VBLR is provided at the bit lines BL and /BL of the memory mat MAT3. The gates of the MOSFETs Q21 through Q23 are supplied with a precharge signal BLEQ3.

The pair of input/output nodes of the sense amplifier SA is connected to the corresponding complementary bit lines BL and /BL of the memory mat MAT1 adjacent thereto on the lower side as viewed in the same drawing through select switch MOSFETs Q51 and Q52 switch-controlled by a select signal SHR1. The pair of input/output nodes of the sense amplifier SA is connected to the corresponding complementary bit lines BL and /BL of the memory mat MAT0 provided on the bit-line far end side of the memory mat MAT1 adjacent thereto on the lower side thereof through select switch MOSFETs Q53 and Q54 switch-controlled by a select signal SHR0. A metal wiring M2 connects between the input/output nodes and the select switch MOSFETs Q53 and Q54 in the same manner as described above. Precharge circuits similar to the above are provided for the complementary bit lines BL and /BL of the respective memory mats MAT1 and MAT0.

Figure 25:
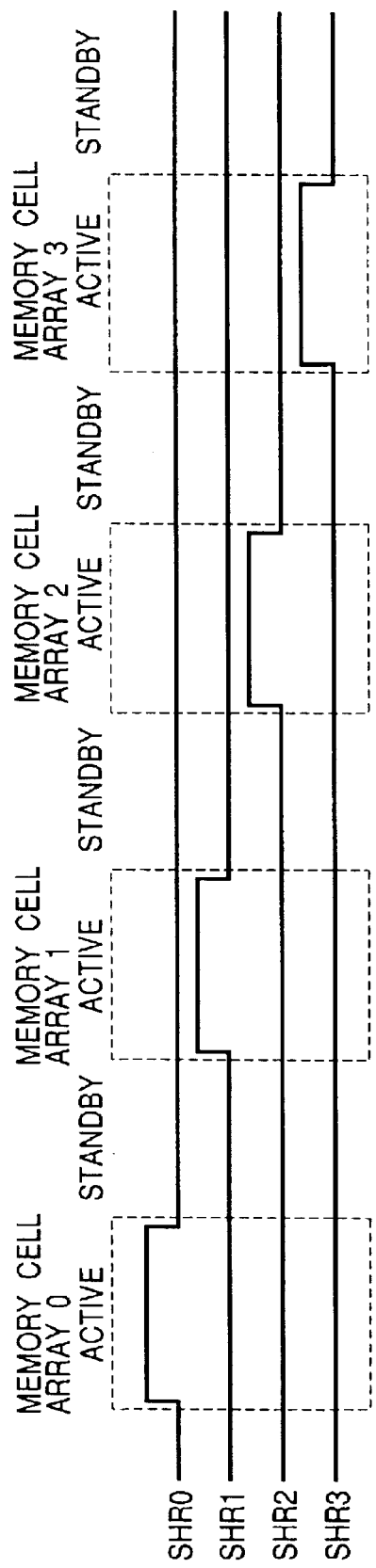
FIG. 25 is a timing diagram for describing one example of a shared selecting operation of the memory cell array shown in FIG. 24.

A timing diagram for describing one example of a shared selecting operation of the memory cell array shown in FIG. 24 is illustrated in FIG. 25. In the present embodiment, the select switch MOSFETs corresponding to the memory mats MAT0 through MAT3 are respectively brought to an off state according to the select signals SHR0 through SHR3 being taken low in level upon standby. At this time, although not shown in the drawing, the precharge signals BLEQ, and BLEQ0 through BLEQ3 are taken high in level, and the input/output nodes of the sense amplifier SA and the complementary bit lines BL and /BL of the respective memory mats MAT0 through MAT3 are respectively precharged by the precharge voltages VBLR.

When, for example, a memory cell array 0 (memory mat MAT0) is taken active, in other words, when a word line of the memory mat MAT0 is selected by the X-system address signal, the precharge signals BLEQ and BLEQ0 become a low level before it, and the input/output nodes of the sense amplifier SA and the bit lines of the memory mat MAT0 are respectively brought to a floating state. The select signal SHR0 changes from a low to a high level according to the operation of selecting the corresponding word line of the memory mat MAT0. Consequently, the select switch MOSFETs Q53 and Q54 are respectively brought to an on state so that the input/output nodes of the sense amplifier SA are connected to the complementary bit lines BL and /BL of the memory mat MAT0 respectively. Thus, the sense amplifier SA performs the rewriting (refresh) of amplifying a small voltage read from a memory cell to the complementary bit lines BL and /BL of the memory mat MAT0 and restoring a storage capacitor of the memory cell to its original charge state.

With the completion of the active operation of the memory cell array 0, the memory cell array is brought to a standby state again and hence the precharge signals BLEQ and BLEQ0 through BLEQ3 are taken active, so the input/output nodes of the sense amplifier SA and the complementary bit lines BL and /BL of the respective memory mats MAT0 through MAT3 are respectively precharged by their corresponding precharge voltages VBLR.

Next, the precharge signals BLEQ and BLEQ1 are brought to a low level according to a memory cell array 1 (memory mat MAT1) being taken active, so the input/output nodes of the sense amplifier SA and the bit lines of the memory mat MAT1 are brought to a floating state. Thus, the select signal SHR1 changes from a low to a high level according to the operation of selecting the corresponding word line of the memory mat MAT1. Consequently, the select switch MOSFETs Q51 and Q52 are respectively brought to an on state so that the input/output nodes of the sense amplifier SA are connected to the complementary bit lines BL and /BL of the memory mat MAT1 respectively. Thus, the sense amplifier SA performs the rewriting (refresh) of amplifying a small voltage read from a memory cell to the complementary bit lines BL and /BL of the memory mat MAT1 and restoring a storage capacitor of the memory cell to its original charge state.

In a manner similar to the above subsequently, the select signal SHR2 and the select signal SHR3 sequentially change from a low to a high level according to a memory cell array 2 (memory mat MAT2) and a memory cell array 3 (memory mat MAT3) being sequentially taken active, so the select switch MOSFETs Q1 and Q2, and Q3 and Q4 are respectively brought to an on state to thereby connect the input/output nodes of the sense amplifier SA to their corresponding complementary bit lines BL and /BL of the memory mats MAT2 and MAT3. Thus, the sense amplifier SA performs the rewriting (refresh) of amplifying a small voltage read from a memory cell to the complementary bit lines BL and /BL of each of the memory mats MAT2 and MAT3 and restoring a storage capacitor of the memory cell to its original charge state.

Thus, since one select signal SHR corresponding to complementary bit lines of a selected memory mat is brought to a high level when four pair of complementary bit lines are assigned to one sense amplifier SA, current consumption developed when the select signal is changed, can be reduced. Namely, the number of changing signals can be reduced to ⅓ as compared with the case in which the select signal SHR is held high in level upon standby as shown in FIG. 14, and when the corresponding memory mat is taken active, the remaining three select switches are brought to a non-select level corresponding to a low level with being left with the corresponding select switch.

The select levels of the select signals supplied to the gates of the shared select switch MOSFETs referred to above result in a boost voltage equivalent to the select level of the word line. Even when, for example, the high level/low level of the bit lines BL and /BL are at a low voltage like 1.8V, a high voltage like 3.6V is taken. When such a high voltage is changed, current consumption also increases correspondingly. Therefore, when the three select signals are changed and only one select signal is changed as described above, current consumption as viewed from the power circuit for forming the step-up or boost voltage can be reduced even to about 20% according to a trial calculation made by the inventors of the present application.

When such a load current can be reduced, current supply capacity of a booster or step-up circuit can also be reduced or cut down 20% correspondingly. Since the step-up circuit forms the above boost voltage using the charge pump as known per se, the efficiency of voltage conversion is poor and much current is used up or consumed even by itself. Thus, since current consumption of the step-up circuit per se can also be reduced in addition to the 20%-reduction in the load current as described above, reducible current consumption increases as a whole. Since the area of a capacitor to be used can be reduced, a chip area can also be reduced.

Such a configuration as to bring one shared select signal corresponding to a selected mat to a high level as in the present embodiment makes it possible to eliminate a restriction on a rise timing margin for a word line and achieve speeding up as well. Namely, when all the shared select signals are held in the selected state upon standby, and the three shared select signals are changed to non-selection with being left with one shared select signal, there is a need to raise the corresponding word line after the shared select switches corresponding to the corresponding non-selected memory mat have been brought to the off state, but such a timing margin can be eliminated in the present embodiment.

FIG. 24 shows the four complementary bit lines (four memory mats) with attention being directed toward one sense amplifier SA. However, the complementary bit lines connected to the sense amplifiers SA disposed on both sides of one memory mat are alternately disposed in the one memory mat as apparent from FIGS. 22, 23 and the like. Namely, the complementary bit lines extending downward from an unillustrated sense amplifier SA adjacent to the upper side of the memory mat MAT3 are disposed so as to adjoin the complementary bit lines BL and /BL of the memory mats MAT2 and MAT3 on the upper side of the sense amplifier SA shown in FIG. 24. Also the complementary bit lines extending upwards from an unillustrated sense amplifier SA adjacent to the lower side of the memory mat MAT0 are disposed so as to adjoin the complementary bit lines BL and /BL of the memory mats MAT0 and MAT1 lying downwardly of the sense amplifier SA of FIG. 24.

When, for example, the word line of the memory mat MAT0 is selected, there is a need to activate the sense amplifier SA shown in the same drawing and the unillustrated sense amplifier SA adjacent to the lower side of the memory mat MAT0 and bring their corresponding select switch MOSFETs to an on state. Therefore, the two shared switch select signals are kept at a high level when a given memory mat is taken active, as shown in FIG. 14. Thus, since six corresponding to the memory mats MAT0 through MAT2, of the eight shared select signals are shown in the embodiment of FIG. 14, the four of the remaining six shared select signals of the above two are brought to a low level. Even in the present embodiment, the two shared select signals associated with the corresponding memory mat taken active, of the eight shared select signals are actually brought to a select level. Even in this case, the number of changing signals can be reduced to $\frac{1}{3}$.

Figure 26:
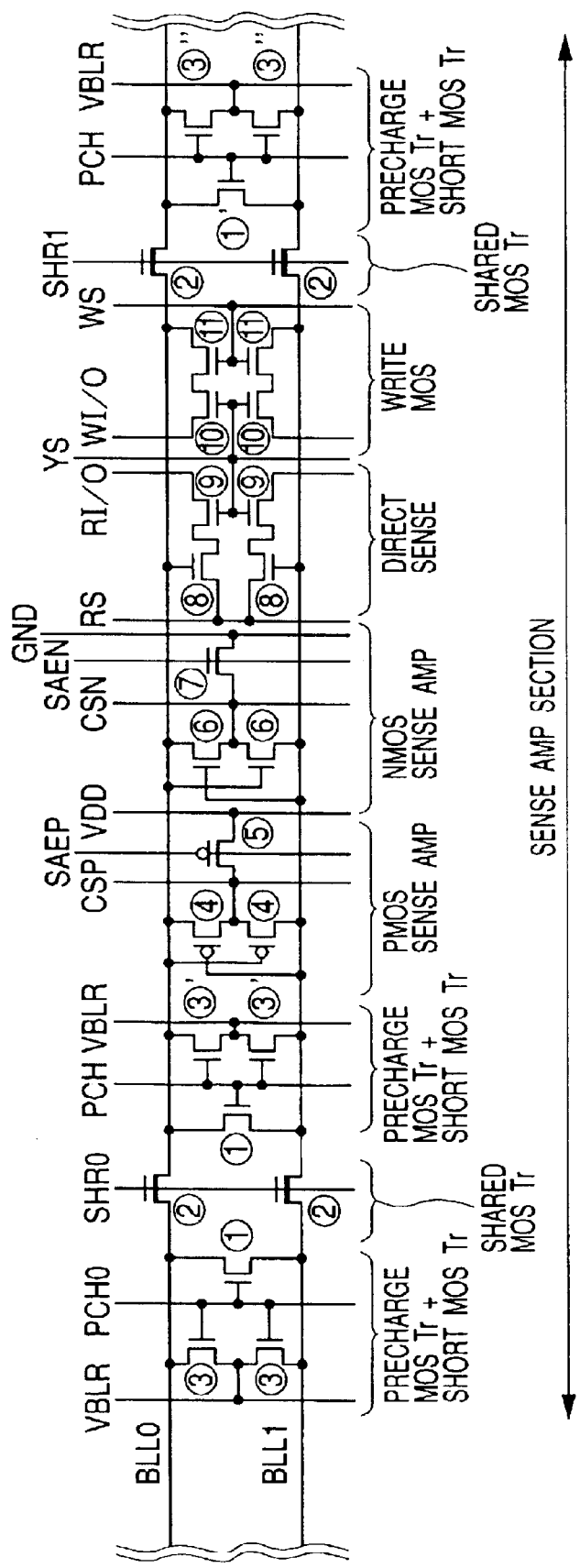
FIG. 26 is a fragmentary circuit diagram showing a still further embodiment of a memory cell array section employed in a dynamic RAM according to the present invention.

A fragmentary circuit diagram showing a still further embodiment of a memory cell array section employed in a dynamic RAM according to the present invention is illustrated in FIG. 26. FIG. 26 is a circuit diagram identical to FIG. 24. In order to explain a device layout to be next described, respective MOSFETs are respectively expressed in numerals with marks ○ in a manner similar to the embodiment of FIG. 3. A point different from the embodiment of FIG. 3 resides in precharge MOS Tr (transistors)+ short MOS Tr respectively expressed in ①' and ③', and ①'' and ③''.

Figure 27:
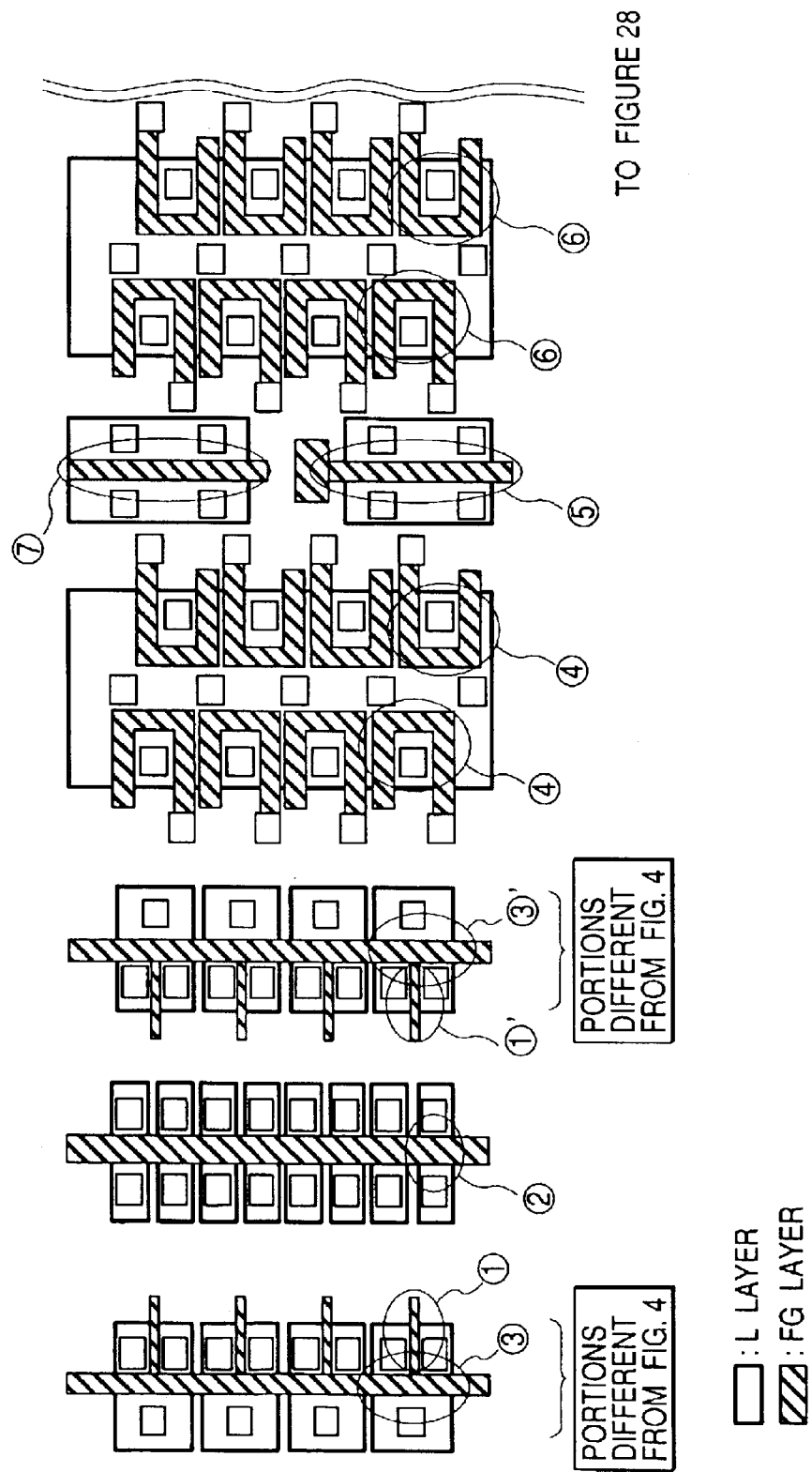
FIG. 27 is a partly layout diagram illustrating L layers and FG layers of respective circuit elements shown in FIG. 26.
Figure 28:
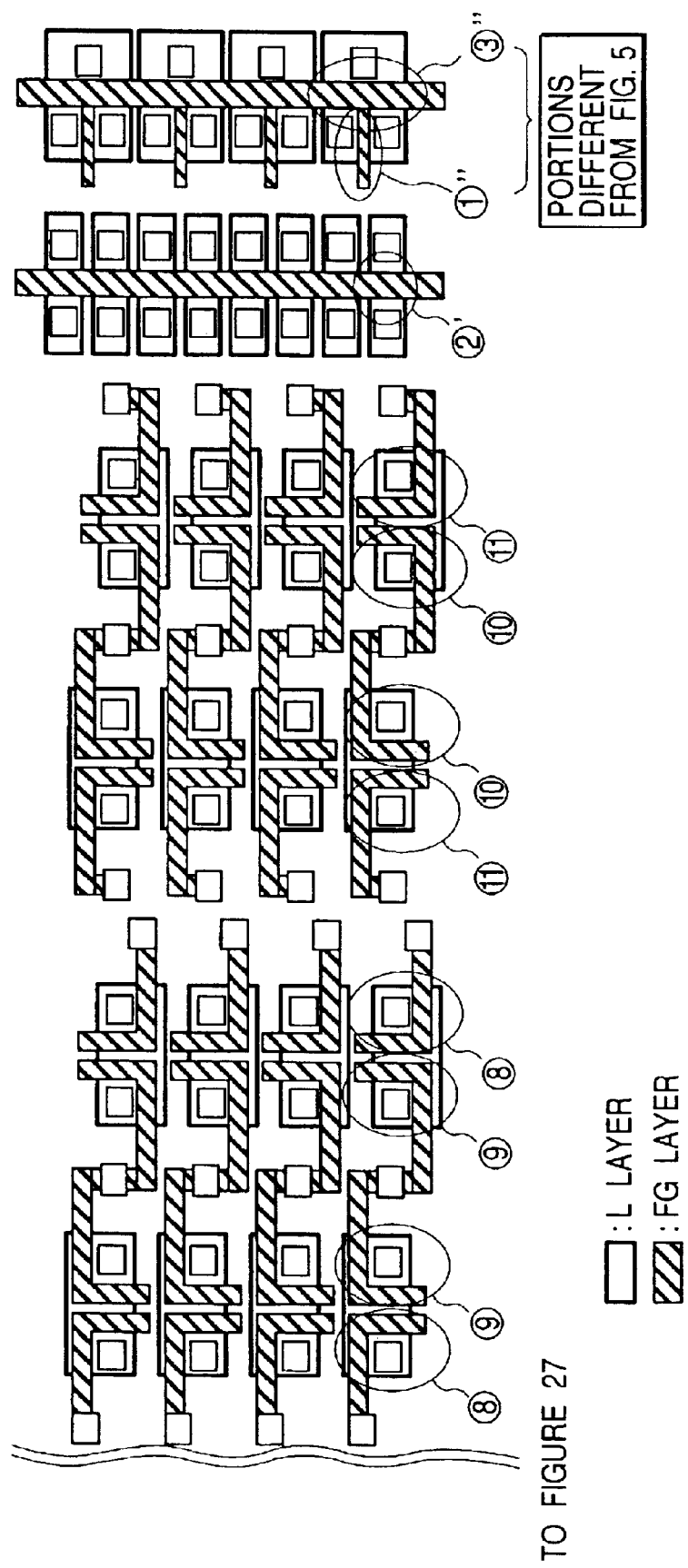
FIG. 28 is a remaining layout diagram showing L layers and FG layers of respective circuit elements shown in FIG. 26.

FIGS. 27 and 28 show layout diagrams of respective circuit elements in FIG. 26. Namely, lower portions of FIG. 28 are joined to upper portions of FIG. 27 to constitute the respective elements in FIG. 26. Semiconductor layers (L layers) each constituting the source and drain of each MOSFET, and FG layers each constituting a gate electrode of each MOSFET are illustrated in FIGS. 27 and 28. Contact portions are expressed in □ with respect to the L layers for the sources and drains and the gate electrodes.

In FIGS. 27 and 28, the term "precharge MOS Tr+short MOS Tr" of FIG. 26 is different from the term "the precharge MOS Tr" in FIGS. 4 and 5. When the "precharge MOS Tr+short MOS Tr" is configured as in the present embodiment, their gates are laid out in the form of a T shape in this way to thereby enable an area-saving layout. A phase shift mask is applied to the portion comprising above "precharge MOS Tr+short MOS Tr". Thus, Lg (channel length) of the "short MOS Tr" can be finely laid out, and the speeding up of a precharge operation can be realized.

Figure 29:
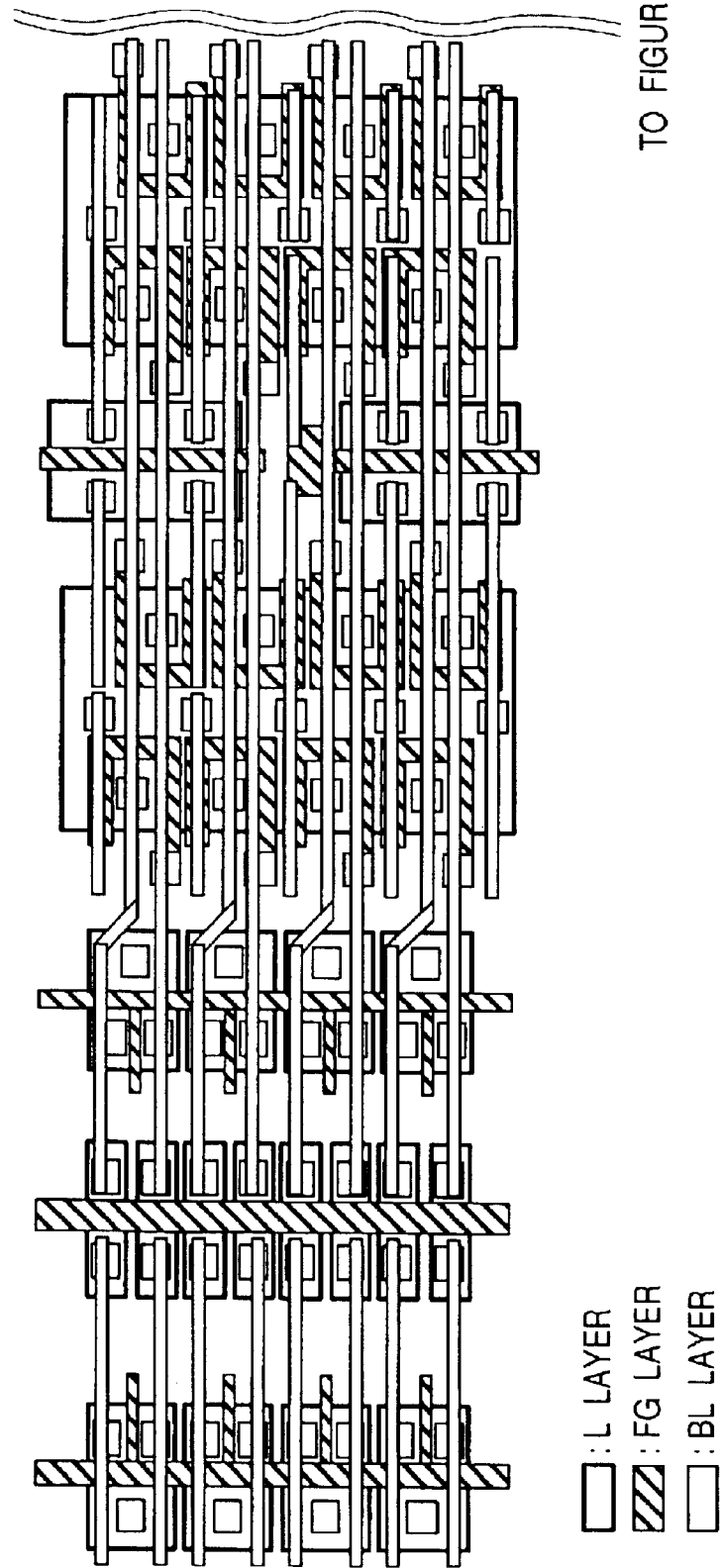
FIG. 29 is a layout diagram depicting BL layers at an upper part of FIG. 27.
Figure 30:
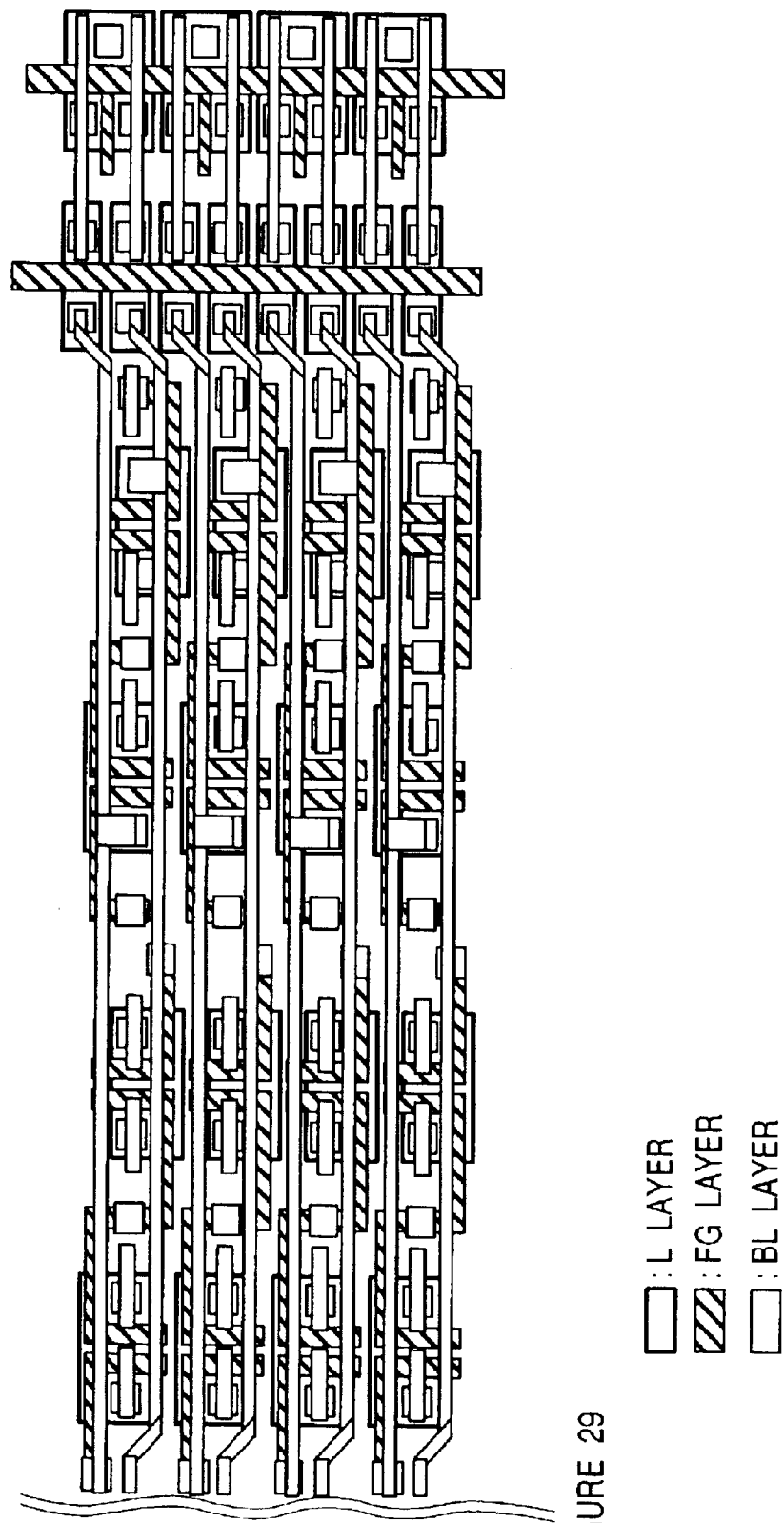
FIG. 30 is a layout diagram showing BL layers at an upper part of FIG. 28.
Figure 31:
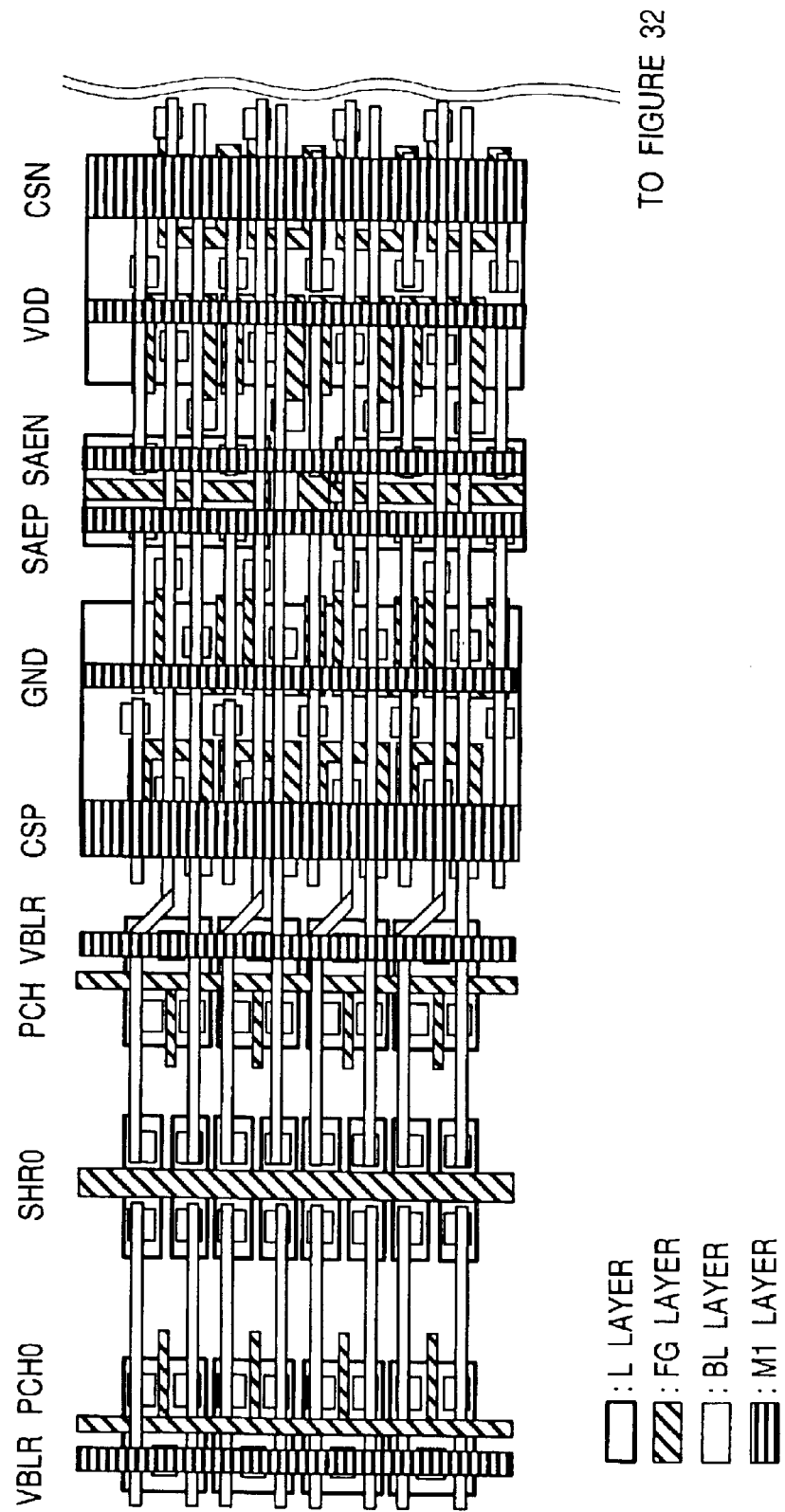
FIG. 31 is a layout diagram illustrating M1 layers at an upper part of FIG. 29.
Figure 32:
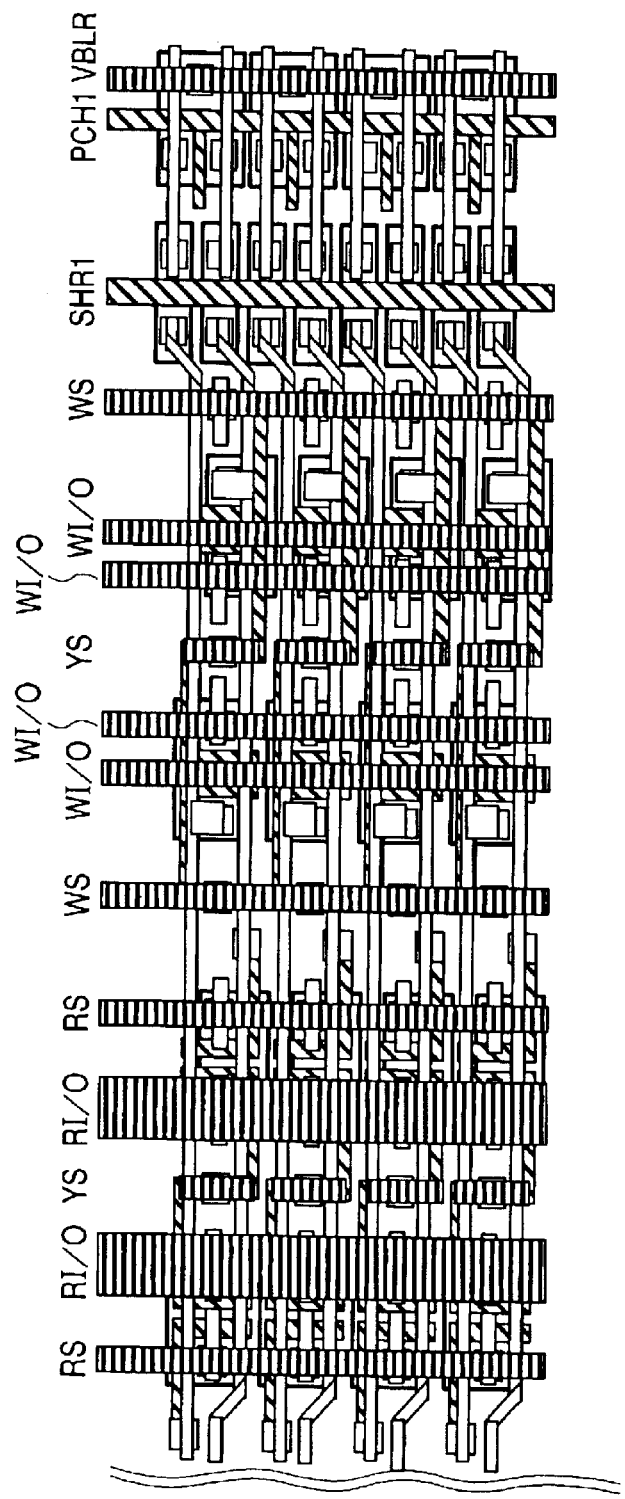
FIG. 32 is a layout diagram illustrating M1 layers at an upper part of FIG. 30.

FIGS. 29 and 30 respectively show BL layers at upper parts of FIGS. 27 and 28. No changes occur in the BL layers as compared with the embodiment shown in FIGS. 6 and 7. M1 layers at the upper parts of FIGS. 29 and 30 are shown in FIGS. 31 and 32. No changes occur in the M1 layers as compared with the embodiment shown in FIGS. 8 and 9.

While the invention developed above by the present inventors has been described specifically based on the illustrated embodiments, the invention of the present application is not limited to the embodiments. It is needless to say that various changes can be made thereto within the scope not departing from the substance thereof. In the embodiment shown in FIG. 1 and the like, for example, a common IO line may be adopted as one in which the write signal line WI/O and the read signal line RI/O are rendered common. The present invention can be widely used in various semiconductor integrated circuit devices each mixed with such a DRAM as described above.

Advantageous effects obtained by a typical one of the inventions disclosed in the present application will be described in brief as follows: At input/output nodes of a sense amplifier including a CMOS latch circuit for performing an amplifying operation in response to an operation timing signal, a pair of first precharge MOSFETs brought to an on state during a precharge period to thereby supply a precharge voltage, and select switch MOSFETs for connecting the input/output nodes and each complementary bit line pair in response to a select signal are provided. A second precharge MOSFET for short-circuiting the complementary bit line pair is provided between the complementary bit line pair. A memory array is provided which includes dynamic memory cells each comprising an address selecting MOSFET and a storage capacitor, each of which is provided between one of the complementary bit line pair and a word line intersecting it. The thickness of a gate insulating film for the second precharge MOSFET is formed thin as compared with that of a gate insulating film for the selecting MOSFETs.

What is claimed is:

1. A semiconductor integrated circuit device, comprising:
   a sense amplifier including a CMOS latch circuit, which amplifies signals on a pair of input/output nodes in response to an operation timing signal and retains the same therein;
   a pair of first precharge MOSFETs connected to the input/output nodes and brought to an on state during a precharge period to thereby supply a precharge voltage to each of the input/output nodes;
   select switch MOSFETs which connect the input/output nodes and each complementary bit line pair in response to a select signal;
   a second precharge MOSFET which is provided between the complementary bit line pair and short-circuit the same; and
   dynamic memory cells each provided between one of the complementary bit line pair and a word line intersecting the same and including an address selecting MOSFET and a storage capacitor;
   wherein the thickness of a gate insulating film of the second precharge MOSFET is formed thinner than that of a gate insulating film of said each select switch MOSFET.

2. The semiconductor integrated circuit device according to claim 1, further including a signal processing circuit constituted of a logic circuit,
   wherein the second precharge MOSFET and MOSFETs contained in the logic circuit are formed with a gate insulating film by the same manufacturing process, and
   wherein the select switch MOSFETs and the address selecting MOSFET constituting the memory cell are formed with a gate insulating film by the same manufacturing process.

3. The semiconductor integrated circuit device according to claim 2, wherein a gate electrode of the second precharge MOSFET is linearly formed in a direction to extend the word line, and the second precharge MOSFET is formed shorter in channel length than the MOSFETs constituting the sense amplifier and the select switch MOSFETs in a manner similar to the MOSFETs contained in the logic circuit.

4. The semiconductor integrated circuit device according to claim 2, wherein a first select switch MOSFET and a second select switch MOSFET are provided on both sides of the sense amplifier with input/output nodes thereof interposed therebetween, and a first complementary bit line pair and a second complementary bit line pair are provided in association with the first select switch MOSFET and the second select switch MOSFET.

5. The semiconductor integrated circuit device according to claim 4,
   wherein a third select switch MOSFET and a fourth select switch MOSFET are respectively provided at a far end of the first complementary bit line pair and a far end of the second complementary bit line pair with respect to the input/output nodes,
   wherein a third complementary bit line pair and a fourth complementary bit line pair are respectively provided in association with the third select switch MOSFET and the fourth select switch MOSFET, and
   wherein the input/output nodes, the third select switch MOSFET and the fourth select switch MOSFET are connected by metal wirings.

6. The semiconductor integrated circuit device according to claim 2, wherein a gate insulating film for the MOSFETs and first precharge MOSFETs constituting the sense amplifier, and a gate insulating film for the second precharge MOSFET are formed by the same manufacturing process.

7. The semiconductor integrated circuit device according to claim 6, wherein a high level of a precharge signal applied to gates of the first and second precharge MOSFETs is a voltage which is lower than a voltage applied to a gate of said each select switch MOSFET and equal to or higher than a voltage on the high level side applied to one of each complementary bit line pair by an amplifying operation of the sense amplifier.

8. The semiconductor integrated circuit device according to claim 4, further including:
   a read-system circuit provided in association with the pair of input/output nodes of the sense amplifier and including amplifying MOSFETs receiving an amplified signal of the sense amplifier at gates thereof, and column select switch MOSFETs; and
   a write-system circuit including MOSFETs for transferring a write signal to the input/output nodes.

9. The semiconductor integrated circuit device according to claim 2, wherein the complementary bit line pair is further provided with P channel type MOSFETs of a latch configuration for amplifying a small voltage difference between the complementary bit line pair, corresponding to the operation of selecting the word line, and P channel type switch MOSFETs for supplying an operating voltage to the P channel type MOSFETs.

10. The semiconductor integrated circuit device according to claim 5, wherein a precharge circuit comprising MOSFETs for short-circuiting the first through fourth complementary bit line pairs and MOSFETs for supplying precharge voltages to the respective complementary bit line pairs is provided for each of the first through fourth complementary bit line pairs.

11. A semiconductor integrated circuit device, comprising:
   a sense amplifier including a CMOS latch circuit, which amplifies signals on a pair of input/output nodes in response to an operation timing signal and retains the same therein;
   a first select switch MOSFET which connects the input/output nodes of the sense amplifier and a first complementary bit line pair provided in association with a first memory mat in response to a first select signal;
   a second select switch MOSFET which connects the input/output nodes of the sense amplifier and a second complementary bit line pair provided in association with a second memory mat in response to a second select signal;
   a third select switch MOSFET which connects the input/output nodes of the sense amplifier and a third complementary bit line pair provided in association with a third memory mat in response to a third select signal;
   a fourth select switch MOSFET which connects the input/output nodes of the sense amplifier and a fourth complementary bit line pair provided in association with a fourth memory mat in response to a fourth select signal; and
   dynamic memory cells each provided between one of the first through fourth complementary bit line pairs of the first through fourth memory mats and a word line intersecting the same and each including an address selecting MOSFET and a storage capacitor,
   wherein any one of the first through fourth select signals is brought to a select level in response to the selection of each word line of any one of the first through fourth memory mats to bring any of the first through fourth select switch MOSFETs to an on state, thereby connecting any of the first through fourth complementary bit line pairs to the pair of input/output nodes of the sense amplifier to perform the operation of amplifying a signal read from the dynamic memory cell.

12. The semiconductor integrated circuit device according to claim 11,
   wherein the first memory mat and the second memory mat are disposed on both sides of the sense amplifier, adjacent to the sense amplifier,
   wherein the third memory mat is disposed on the far end side of the first complementary bit line pair of the first memory mat with the sense amplifier as the reference so as to interpose the first memory mat therebetween,
   wherein the fourth memory mat is disposed on the far end side of the second complementary bit line pair of the second memory mat with the sense amplifier as the reference so as to interpose the second memory mat therebetween,
   wherein a metal wiring layer formed over the first complementary bit line pair of the first memory mat connects between the input/output nodes of the sense amplifier and the third select switch MOSFET of the third memory mat, and
   wherein a metal wiring layer formed over the second complementary bit line pair of the second memory mat connects between the input/output nodes of the sense amplifier and the fourth select switch MOSFET of the fourth memory mat.

13. The semiconductor integrated circuit device according to claim 12, wherein a precharge circuit comprising MOSFETs for short-circuiting the first through fourth complementary bit line pairs and MOSFETs for supplying precharge voltages to the respective complementary bit line pairs is provided for each of the first through fourth complementary bit line pairs.

* * * * *